(12) United States Patent
Oshimi et al.

(10) Patent No.: US 10,360,144 B2
(45) Date of Patent: Jul. 23, 2019

(54) STORAGE APPARATUS AND NON-VOLATILE MEMORY DEVICE INCLUDING A CONTROLLER TO SELECTIVELY COMPRESS DATA BASED ON AN UPDATE FREQUENCY LEVEL

(71) Applicant: HITACHI, LTD., Tokyo (JP)

(72) Inventors: Masatsugu Oshimi, Kanagawa (JP);
Yoshihiro Oikawa, Kanagawa (JP);
Hiroshi Hirayama, Tokyo (JP); Junji Ogawa, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 15/545,094

(22) PCT Filed: Feb. 27, 2015

(86) PCT No.: PCT/JP2015/055886
§ 371 (c)(1),
(2) Date: Jul. 20, 2017

(87) PCT Pub. No.: WO2016/135954
PCT Pub. Date: Sep. 1, 2016

(65) Prior Publication Data
US 2017/0351602 A1    Dec. 7, 2017

(51) Int. Cl.
*G06F 12/02* (2006.01)
*G06F 3/06* (2006.01)
(Continued)

(52) U.S. Cl.
CPC .......... *G06F 12/0238* (2013.01); *G06F 3/061* (2013.01); *G06F 3/0608* (2013.01);
(Continued)

(58) Field of Classification Search
CPC .... G06F 12/0238; G06F 3/0608; G06F 3/061; G06F 3/0655; G06F 12/00; G06F 12/04;
(Continued)

(56) References Cited

U.S. PATENT DOCUMENTS 8,478,731 B1 * 7/2013 Throop ............. G06F 17/30153
707/693
9,355,112 B1 * 5/2016 Armangau ........ G06F 17/30153
(Continued)

FOREIGN PATENT DOCUMENTS

| JP | 2009-230513 A | 10/2009 |
| JP | 2010-152516 A | 7/2010 |
| JP | 2011-128792 A | 6/2011 |

OTHER PUBLICATIONS

International Search Report, PCT/JP2015/055886, dated Apr. 21, 2015, 2 pgs.

*Primary Examiner* — Glenn Gossage
(74) *Attorney, Agent, or Firm* — Volpe and Koenig, P.C.

(57) ABSTRACT

A storage apparatus includes a non-volatile memory and a controller to determine whether or not to compress data at a time when a non-volatile memory device receives the data from a host apparatus. A storage controller transmits a specified logical address range, an update frequency level of the specified logical address range, and specified data to a device controller. The update frequency level may indicate whether data is Hot or Cold. On the basis of the update frequency level of the specified logical address range, the device controller determines whether to compress the specified data. When a determination is made to compress the specified data, the device controller compresses the specified data to generate compressed data, and writes the compressed data into a non-volatile memory which may be a flash memory device. A degradation rank of physical blocks in the flash memory may include at least Young and Old. Recla-
(Continued)

mation processing including selecting a migration destination on the basis of the updated frequency level may also be performed. When a determination is made not to compress the specified data, the device controller writes the specified data into the non-volatile memory.

11 Claims, 20 Drawing Sheets

(51) Int. Cl.
G11C 16/34 (2006.01)
G06F 12/00 (2006.01)
G06F 12/04 (2006.01)
G11C 7/10 (2006.01)
G11C 11/56 (2006.01)
G11C 16/04 (2006.01)

(52) U.S. Cl.
CPC .......... *G06F 3/0649* (2013.01); *G06F 3/0655* (2013.01); *G06F 3/0688* (2013.01); *G06F 12/00* (2013.01); *G06F 12/04* (2013.01); *G11C 7/1045* (2013.01); *G11C 11/5628* (2013.01); *G11C 11/5642* (2013.01); *G11C 16/0475* (2013.01); *G11C 16/3418* (2013.01); *G11C 2207/102* (2013.01)

(58) Field of Classification Search
CPC .............. G11C 7/1045; G11C 11/5628; G11C 11/5642; G11C 16/0475; G11C 16/3418; G11C 2207/102
See application file for complete search history.

(56) References Cited

U.S. PATENT DOCUMENTS

| | | |
|---|---|---|
| 2010/0161884 A1 | 6/2010 | Kurashige |
| 2011/0145486 A1 | 6/2011 | Owa et al. |
| 2012/0072641 A1 | 3/2012 | Suzuki et al. |
| 2012/0185648 A1* | 7/2012 | Benhase ................. G06F 12/08 711/118 |
| 2013/0073798 A1* | 3/2013 | Kang .................. G06F 12/0246 711/103 |
| 2013/0246686 A1* | 9/2013 | Noborikawa ......... G06F 3/0604 711/102 |
| 2013/0262749 A1* | 10/2013 | Oikawa ................. G06F 11/004 711/103 |

* cited by examiner

FIG.20

| # | State of block | Trigger | Update frequency level | Degradation rank |
|---|---|---|---|---|
| 1 | Uncompleted block | Write error | Hot→ Unchanged | Young |
| 2 | | | Cold→Unchanged | Old |
| 3 | | Uncorrectable error | Hot→Unchanged | Young |
| 4 | | | Cold→Unchanged | Old |
| 5 | | Write has not been completed after lapse of given period of time | Hot→Cold | Old |
| 6 | | | Cold→Unchanged | Old |
| 7 | Completed block | Retention (left for given period of time) | Hot→Cold | Old |
| 8 | | | Cold→Unchanged | Old |
| 9 | | Uncorrectable error | Hot→Unchanged | Young |
| 10 | | | Cold→Unchanged | Old |

US 10,360,144 B2

STORAGE APPARATUS AND NON-VOLATILE MEMORY DEVICE INCLUDING A CONTROLLER TO SELECTIVELY COMPRESS DATA BASED ON AN UPDATE FREQUENCY LEVEL

TECHNICAL FIELD

This invention relates to a non-volatile memory device.

BACKGROUND ART

SSDs (Solid State Disks) are known as flash memory devices using flash memories. Flash memory devices are higher in speed than hard disk drives (HDDs), but are more expensive than HDDs. Flash memory devices configured to reduce the amount of data by a compression function for the purpose of reducing bit cost are known.

In a flash memory device configured to store data after compressing every data, however, when compressed data stored in the flash memory device is to be updated, the flash memory device reads the compressed data from a flash memory, expands, updates, and compresses the read data, and writes the resultant data into the flash memory, with the result that transfer performance of the flash memory device is reduced. As a solution, flash memory devices configured to compress a part of data are known.

Patent Literature 1 (PTL 1) indicates that, in reclamation or refresh, a flash memory device determines a read frequency of data to be migrated, compresses data having a read frequency lower than a threshold, and writes the resultant data.

CITATION LIST

Patent Literature

[PTL 1]
US Patent Application Publication No. 2012/0072641

SUMMARY OF INVENTION

Technical Problem

The above-mentioned flash memory device can determine whether to compress data in internal data migration processing, such as reclamation and refresh, but does not determine whether to compress data at the timing at which the data is received from a host apparatus. Thus, every data needs to be temporarily stored in an uncompressed form.

Solution to Problem

In order to solve the above-mentioned problem, a storage apparatus according to one aspect of this invention includes: a non-volatile memory device; and a storage controller coupled to the non-volatile memory device and to a host computer. The non-volatile memory device includes: a non-volatile memory; and a device controller coupled to the non-volatile memory and to the storage controller. The storage controller is configured to determine an update frequency level indicating a degree of update frequency of a specified logical address range on the basis of management information on a logical address range. The storage controller is configured to transmit the specified logical address range, the update frequency level of the specified logical address range, and specified data to the device controller. The device controller is configured to determine whether to compress the specified data on the basis of the update frequency level of the specified logical address range. When a determination is made to compress the specified data, the device controller is configured to compress the specified data to generate compressed data, and write the compressed data into the non-volatile memory. When a determination is made not to compress the specified data, the device controller is configured to write the specified data into the non-volatile memory.

Advantageous Effects of Invention

The non-volatile memory device can determine whether to compress data received from the host apparatus.

BRIEF DESCRIPTION OF DRAWINGS

FIG. 20 illustrates a list of operations in the refresh processing.

DESCRIPTION OF EMBODIMENTS

Figure 1:
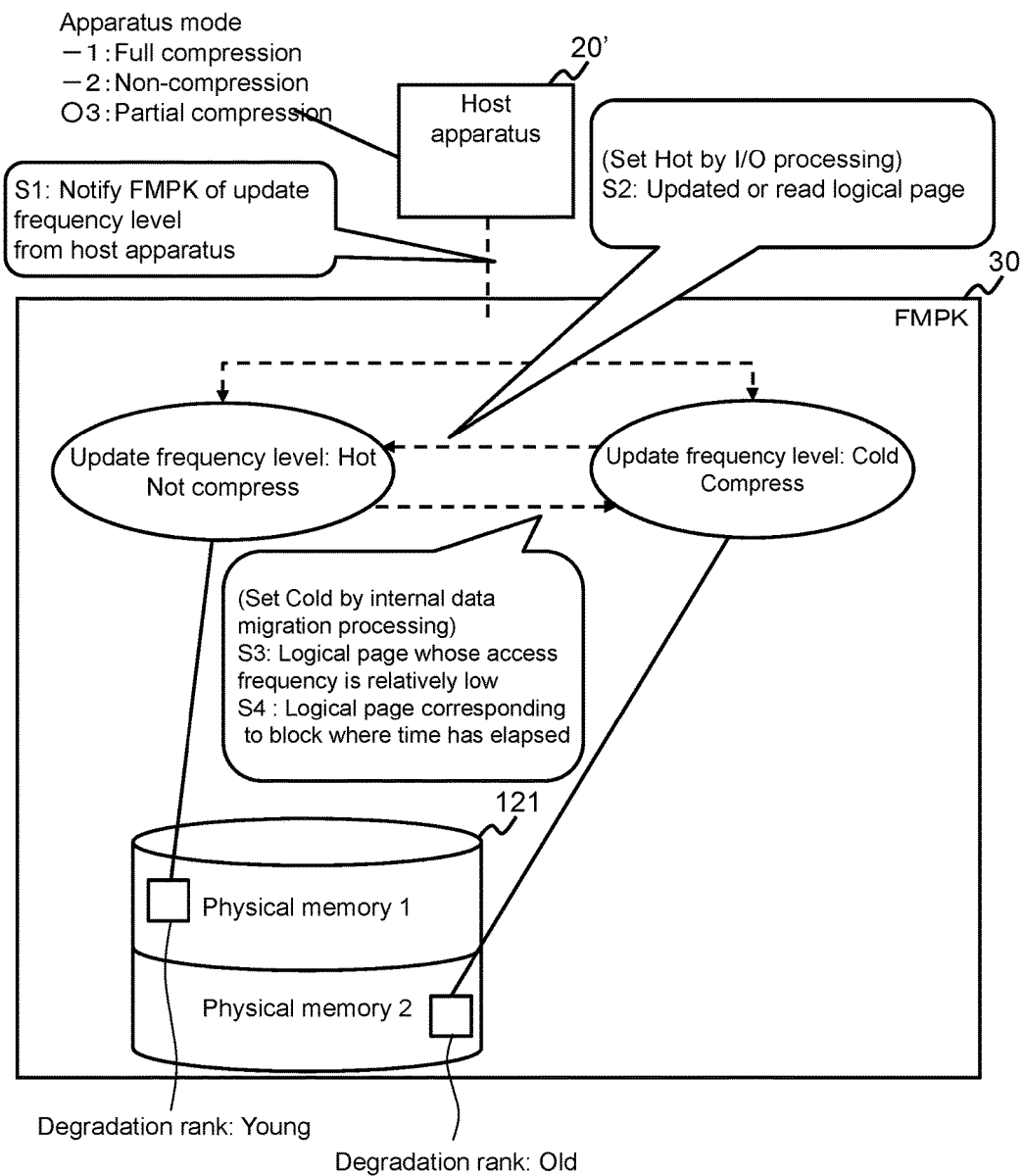
FIG. 1 illustrates the operations of a host apparatus and flash memory package (FMPK) based on update frequency level and compression mode.

Referring to the accompanying drawings, one embodiment is described below.

In the following description, various kinds of information are sometimes described with the expression "kkk table" or "kkk queue", but various kinds of information may be expressed by another data structure than the table. At least one of the "kkk table" or the "kkk queue" can be referred to as "kkk information" in order to indicate that the information is independent of the data structure.

In the following description, identification numbers are used as identification information on various targets, but other kinds of identification information than identification numbers (for example, identifiers including letters or symbols) can be employed as well.

In the following description, processing is sometimes described with "program" as the subject. A program, however, is executed by a processor (such as a CPU (Central Processing Unit)) to implement predetermined processing with appropriate use of storage resources (such as memory) and/or a communication interface device (such as a communication port). The subject of processing may therefore be a processor (or an apparatus such as a controller having the processor). Processing described with a processor (or an apparatus such as a controller having the processor) as the subject may be regarded as processing implemented by executing one or more programs. The processor may include a hardware circuit configured to implement a part or all of processing implemented by the processor. A computer program may be installed to each computer from a program source. Examples of the program source include a program distribution server and a storage medium.

In the following description, the communication interface device is sometimes abbreviated as "I/F".

In the following description, a flash memory package device (flash memory package is hereinafter abbreviated as "FMPK") having a flash memory is taken as an example of a non-volatile memory device having a non-volatile memory. Instead of the flash memory device, non-volatile memory devices having other kinds of non-volatile memories (for example, semiconductor memories such as MRAM (Magnetoresistive Random Access Memory) as magnetoresistive memory, ReRAM (Resistance Random Access Memory) as resistance variable memory, and FeRAM (Ferroelectric Random Access Memory) as ferroelectric memory) can be employed.

The flash memory includes a plurality of physical blocks. Each physical block includes a plurality of physical pages. The flash memory device divides a logical address space to be provided to a host apparatus into a plurality of logical pages for management, allocates physical pages to the logical pages, receives an I/O command for specifying a logical page, and accesses a physical page corresponding to the logical page. Hereinafter, the physical block is sometimes referred to simply as block.

In the following description, "LU" is an abbreviation for a logical unit, which is referred to as logical volume as well. The LU is a logical storage device. The LU may be a real LU (RLU) or may be a virtual LU (VLU). The LU is provided to an external apparatus (for example, a host 10 described later) coupled to a storage apparatus for providing the LU. The "RLU" is an LU based on physical storage resources (for example, a RAID (Redundant Array of Independent (or Inexpensive) Disks) group formed of a plurality of PDEVs) included in a storage apparatus for providing the RLU. PDEV is an abbreviation for a non-volatile physical storage device. The "VLU" is an LU that is formed of a plurality of virtual chunks (virtual storage areas) and is compliant with capacity virtualization technology (typically, Thin Provisioning). The VLU is allocated with real chunks (physical storage areas) from a pool. The "pool" is a storage area that is formed of a plurality of real chunks and is based on the same or different kinds of one or more PDEVs.

In the following description, the update frequency level of a logical address range includes at least Hot (second level) and Cold (first level). Hot means that the update frequency is relatively high, and Cold means that the update frequency is relatively low. The "logical address range whose update frequency is relatively high" may be a logical address range whose update frequency is equal to or larger than a first frequency threshold, or may be a logical address range whose update frequency is included in the top P % (0<P<100) among a plurality of logical address ranges. The "logical address range whose update frequency is relatively low" may be a logical address range whose update frequency is smaller than the first frequency threshold (or smaller than a second frequency threshold that is lower than the first frequency threshold), or may be a logical address range whose update frequency is included in the bottom Q % (Q is the same value as 100-P or a smaller value) among the plurality of logical address ranges. The update frequency level may further include a third level other than Hot and Cold. For example, the third level may be a level between Hot and Cold.

In the following description, the degradation rank of physical blocks in the flash memory includes at least Young (second rank) and Old (first rank). A physical block of Young is a physical block whose degree of degradation is relatively small. A physical block of Old is a physical block whose degree of degradation is relatively large. The degree of degradation may be based on the number of times of deletion, or a value calculated on the basis of the number of times of deletion, the number of corrected bits, temperature, write frequency, and other such parameters. The "physical block whose degree of degradation is relatively large" may be a physical block whose degree of degradation is equal to or larger than a first degradation degree threshold, or may be a physical block whose degree of degradation is included in the top V % (0<V<100) among a plurality of physical blocks. The "physical block whose degree of degradation is relatively small" may be a physical block whose degree of degradation is smaller than the first degradation degree threshold (or smaller than a second degradation degree threshold that is lower than the first degradation degree threshold), or may be a physical block whose degree of degradation is included in the bottom W % (W is the same value as 100-V or a smaller value) among the plurality of physical blocks. The first degradation degree threshold (and second degradation degree threshold) may be variable values that change in accordance with an average value or the like of degrees of degradation of the plurality of physical blocks. The degradation rank may further include a value other than Young and Old. In the following description, however, physical blocks are classified into two kinds of Young and Old depending on the degradation rank.

FIG. 1 illustrates operations of a host apparatus and flash memory package (FMPK) based on update frequency level and compression mode.

A FMPK (Flash Memory Package) 30 is coupled to a host apparatus 20. The FMPK 30 is a flash memory device, such as an SSD.

The host apparatus 20 may set any one of a full compression mode, a non-compression mode, and a partial compression mode as an apparatus mode of the FMPK 30.

The full compression mode is a mode for users who place importance on the life of the memory. In the full compression mode, data is compressed and written into all physical pages, thereby reducing a write address range of the flash memory. In the full compression mode, however, compression and expansion processing is always required at the time of accessing, and hence the performance is reduced.

The non-compression mode is a mode for users who place importance on performance. The non-compression mode data is written into all physical pages in an uncompressed form without performing compression and expansion processing, and hence the performance is high. The non-compression mode, however, cannot extend the life of the memory.

The partial compression mode is a mode for users who want to secure both performance and the life of the memory. In the partial compression mode, data whose update frequency level is set to Hot is not compressed, and hence the performance degradation can be suppressed. In the partial compression mode, data whose update frequency level is set to Cold is compressed, and hence a write address range of the flash memory can be reduced.

In this embodiment, the partial compression mode is described.

The FMPK 30 performs I/O processing on the basis of an I/O command from the host apparatus 20, and performs internal data migration processing on the basis of the state of the FMPK 30. The I/O processing includes new write processing, update write processing, and read processing.

Examples of the internal data migration processing in the FMPK 30 include reclamation processing and refresh processing. The refresh processing is processing of reading data (in particular, valid data) from a physical block to correct an error, and migrating the error-corrected data to another physical block (for example, a physical block whose degree of degradation is lower than that of a physical block of a migration source). In the refresh processing, the migration source physical block may be a physical block where a given time or more has elapsed since data was written in a predetermined area (for example, first physical page), or a physical block where an error of a predetermined type has been detected a predetermined number of times or more. The reclamation processing is processing of migrating valid data in a migration source physical block (physical block of a reclamation target) to another physical block and deleting data from the migration source physical block. In the reclamation processing, the migration source physical block may be a physical block whose invalid data rate exceeds a predetermined threshold. The start of the reclamation processing may be triggered when the number of physical blocks (free blocks) that are not allocated to the LBA falls below a predetermined threshold (free blocks run short).

(S1) When the FMPK 30 receives a command including an update frequency level, such as a write command for new write, from the host apparatus 20, the FMPK 30 allocates a block having a degradation rank corresponding to the update frequency level to a target logical page of the command. When the update frequency level included in the write command for new write is Hot, the FMPK 30 allocates a physical page in a block having a degradation rank of Young to the target logical page, and writes compressed data of the write data into the physical page. When the update frequency level included in the write command for new write is Cold, the FMPK 30 allocates a physical page in a block having a degradation rank of Old to the target logical page, and writes uncompressed data of the write data into the physical page. For example, the FMPK 30 stores the update frequency level in the physical page together with data.

(S2) When the FMPK 30 receives an I/O command (write command for update write, or read command) to access the data stored in the FMPK 30 from the host apparatus 20, the FMPK 30 sets the update frequency level of the target logical page of the I/O command to Hot.

(S3) In the reclamation processing, the FMPK 30 sets a logical page having a relatively low access frequency to Cold. The access frequency includes at least one of an update frequency or a read frequency.

(S4) In the refresh processing, the FMPK 30 sets logical pages to cold based on whether a predetermined time has elapsed since the block was written.

Hot may be divided into a plurality of update frequency levels. For example, an update frequency level indicating that data is to be compressed forcibly despite being Hot may be defined.

The FMPK 30 in this embodiment uses a reclamation (RCM) count, which is the number of times by which a logical page is migrated by the reclamation processing without being updated, to update the update frequency level for each logical page.

Figure 2:
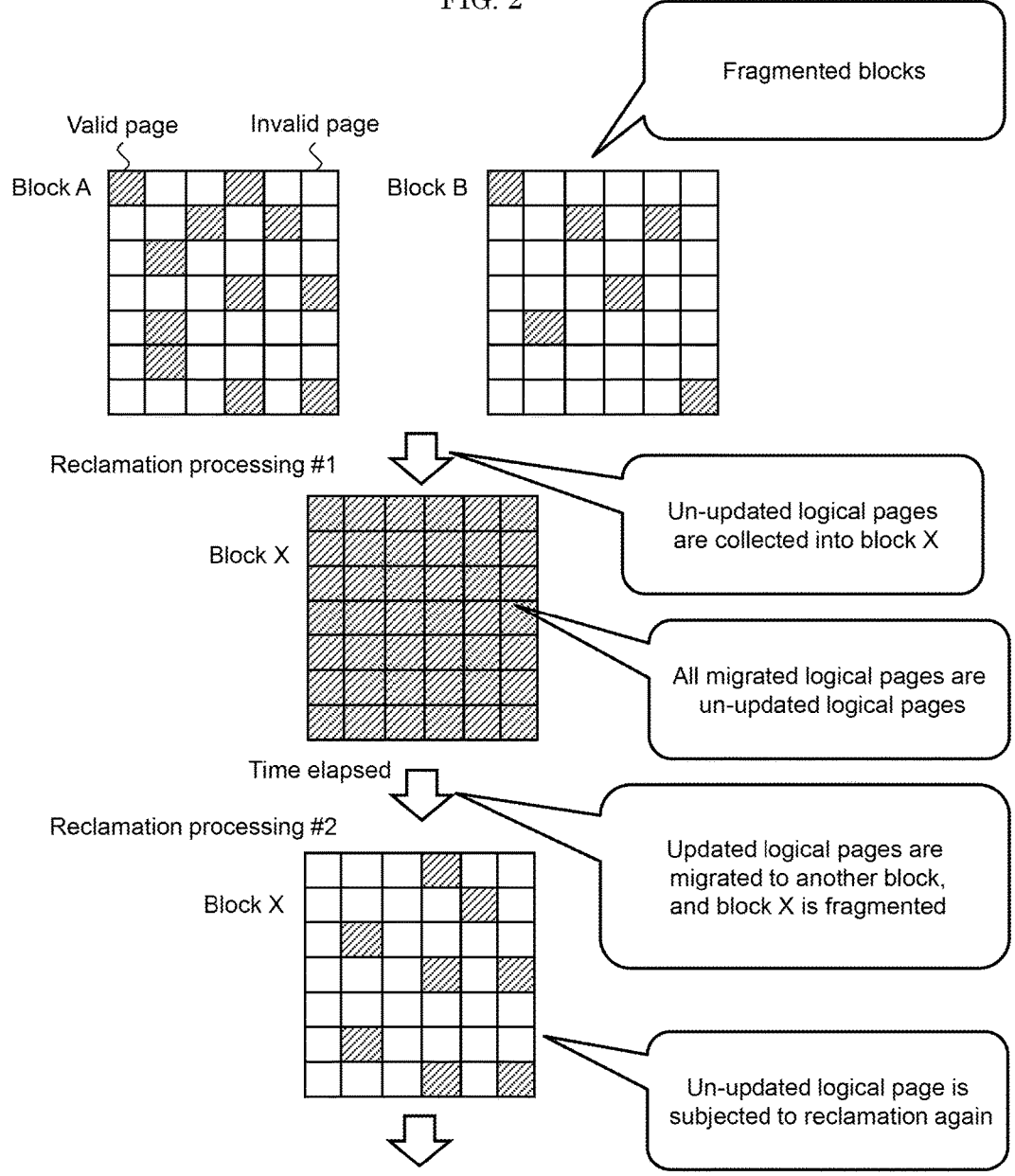
FIG. 2 shows migration source and destination blocks containing logical pages and illustrates a relation between reclamation processing and an update frequency.

FIG. 2 illustrates a relation between the reclamation processing and the update frequency.

In reclamation processing #1, the FMPK 30 selects fragmented blocks A and B as migration source blocks, selects a block X, which is a free block, as a migration destination block, and all valid data stored in the migration source blocks is migrated to the migration destination block. The reclamation processing #1 allocates physical pages of the migration destination to logical pages allocated with valid pages in the migration source blocks. After that, the CPU 42 (shown in FIG. 3) deletes the migration source blocks, and changes the migration source blocks to free blocks.

Shaded physical pages among a plurality of physical pages in each block are valid pages, in each of which valid data is stored that has not been updated after being written into the migration source block. White physical pages are invalid pages, in each of which stores invalid data that has been updated after being written into the migration source block and written into another block. In other words, in the migration source block, the valid page has not been updated for a longer period of time, compared to the invalid page which has been updated.

The reclamation processing involves selecting a valid page as a reclamation target page and migrating valid data stored in the reclamation target page to the block X. Therefore, the block X after the reclamation processing #1 stores data that has not been updated for a relatively long period of time.

After the reclamation processing #1, when data stored in a valid page in the block X is updated, the valid page becomes an invalid page. After time has elapsed, the block X is fragmented.

In the next reclamation processing #2, the block X is selected as a migration source block. A valid page in the block X stores data that has not been updated after the reclamation #1, and is selected as a reclamation target page again in the reclamation processing #2.

When the FMPK 30 updates data in response to a write command from the host apparatus 20', the FMPK 30 resets the RCM count of the updated logical page to 0.

The FMPK 30 counts the reclamation count for each logical page, thereby being capable of determining that a logical page having a relatively large reclamation count is a logical page having a relatively low update frequency.

Figure 3:
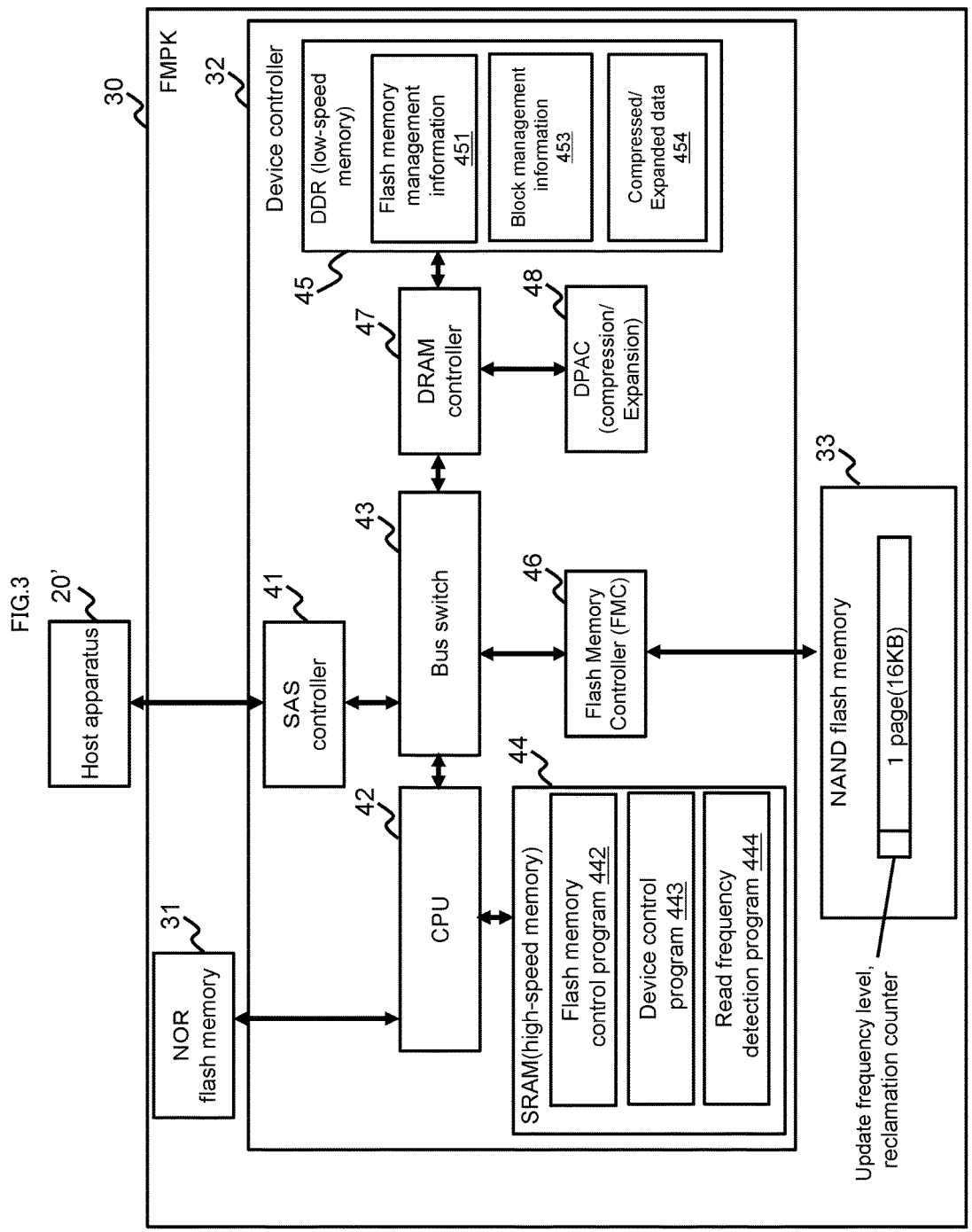
FIG. 3 illustrates a configuration of an FMPK 30.

FIG. 3 illustrates the configuration of the FMPK 30.

The FMPK 30 includes a NOR flash memory (hereinafter NOR-FM) 31, a device controller 32, and a NAND flash memory (hereinafter NAND-FM) 33.

The NOR-FM 31 stores at least one of a program executed by the CPU 42 and information used by the CPU 42.

The NAND-FM 33 is a non-volatile memory, and includes one or more NAND-FM chips. The NAND-FM chips may be either of an SLC (Single Level Cell) type or an MLC (Multi Level Cell) type. When the device controller 32 having received a write command from the host apparatus 20' issues a write request, data is stored in the NAND-FM 33 in accordance with the write request.

Each of the one or more NAND-FM chips includes a plurality of physical blocks. Each of the plurality of physical blocks has a plurality of physical pages. In the NAND-FM 33, data are read and written in units of pages and are erased in units of blocks. The NAND-FM 33 is a so-called write-once memory, and data cannot overwritten into a physical page. Update data of data written in a page is written into another free page (free physical page). In each physical block, write destinations of data are sequentially shifted from the first free page to the last free page. Hereinafter, a physical block having a free page at the end is referred to as uncompleted block (open block, write-in-progress block), and a block without any free page is referred to as completed block (write-completed block). Physical pages include valid pages and invalid pages in addition to free pages. A valid page is a physical page in which valid data is stored, and an invalid page is a physical page in which invalid data is stored. Valid data is the latest data on a corresponding logical address range, and invalid data is old data updated by valid data.

Each physical page in the NAND-FM 33 stores an update frequency level and a reclamation counter in addition to data. The update frequency level is represented by a Cold flag indicating whether the update frequency level is Cold. The reclamation counter indicates an RCM count of a corresponding logical page.

The device controller 32 includes a CPU 42, a SAS (Serial Attached SCSI) controller 41, a bus switch 43, a DRAM controller 47, a low-speed memory 45, a high-speed memory 44, a flash memory controller (FMC) 46, and a compression and expansion circuit (DPAC) 48.

The SAS controller 41 is a communication interface device coupled to the host apparatus 20', and mediates data communication between the host apparatus 20' and sections on the bus switch 43 side. The SAS controller 41 performs data communication with the host apparatus 20' in accordance with the SAS protocol. The host apparatus 20' is a storage controller to described later as an example, but may be a computer such as a PC (Personal Computer) instead of the storage controller.

The bus switch 43 is coupled to the CPU 42, the SAS controller 41, the DRAM controller 47, and the flash memory controller (FMC) 46, and relays data among these sections.

The DRAM controller 47 is a communication interface device coupled to the low-speed memory 45, and controls the input and output of data to and from the low-speed memory 45.

The low-speed memory 45 is, for example, a DRAM (Dynamic Random Access Memory) such as a DDR-SDRAM (Double-Data-Rate-Synchronous Dynamic Random Access Memory) or a non-volatile memory, and stores various kinds of data used by the CPU 42 for processing. The low-speed memory 45 is hereinafter sometimes referred to as DDR. The low-speed memory stores FM (flash memory) management information 451, block management information 453, and compressed/expanded data 454.

The FM management information 451 stores information necessary for management of the NAND-FM 33. The FM management information 451 may include logical-physical conversion information representing a correspondence relation between a logical address (for example, logical block address (LBA)) and a physical address (for example, physical block address (PBA)). For example, the FM management information 451 may further include the number of Young blocks and the number of Old blocks.

The compressed/expanded data 454 is either of compressed data generated by compression or uncompressed data generated by expansion.

The block management information 453 includes information on each physical block.

The high-speed memory 44 is, for example, an SRAM (Static Random Access Memory), and is directly coupled to the CPU 42. The high-speed memory 44 stores programs and the like executed by the CPU 42. In this embodiment, the high-speed memory 44 stores a flash memory control program (hereinafter FM control program) 442, a device control program 443, and a read frequency detection program 444.

The device control program 443 receives an I/O command from the host apparatus 20', and makes an instruction to the FM control program 442 on the basis of the I/O command.

The FM control program 442 executes I/O processing on the basis of the instruction from the device control program 443, and executes internal data migration processing on the basis of the state of the NAND-FM 33. The state of the NAND-FM 33 may include the degree of degradation of each block, information on whether each block includes a free page, the invalid data rate of each block, the elapsed time from the start of write in each block, the RCM count of each logical page, the update frequency level of each logical page, and the read frequency of each block.

The read frequency detection program 444 statistically measures the read frequency for each block, and records the read frequency in the block management information 453. The read frequency may be measured for another physical storage area such as the substrate and chip of the NAND-FM 33 and physical pages. The read frequency detection program 444 may detect a read disturb. Read disturb is a phenomenon that, when cells near a cell are repeatedly read, the cell cannot be read. The occurrence of a read disturb indicates that the read frequencies of neighborhood cells are relatively high.

The FMC 46 is a communication interface device coupled to the NAND-FM 33, and controls the input and output of data to and from the NAND-FM 33.

The DPAC 48 is coupled to the DRAM controller 47. The DPAC 48 compresses uncompressed data stored in the low-speed memory 45 in accordance with an instruction of compression from the CPU 42, thereby generating compressed data. The DPAC 48 further expands compressed data stored in the low-speed memory 45 in accordance with an instruction of expansion from the CPU 42, thereby generating uncompressed data.

The configuration of the FMPK 30 is not limited to the configuration in FIG. 3. For example, the NOR-FM 31 may be omitted, and the program or information in the NOR-FM 31 may be stored in at least one of the high-speed memory 44 or the low-speed memory 45. Instead of a plurality of memories having different levels of performance, such as the high-speed memory 44 and the low-speed memory 45, one or more memories having the same performance may be employed.

The storage apparatus 300 to which a host apparatus 20' and the FMPK 30 are applied is now described.

Figure 4:
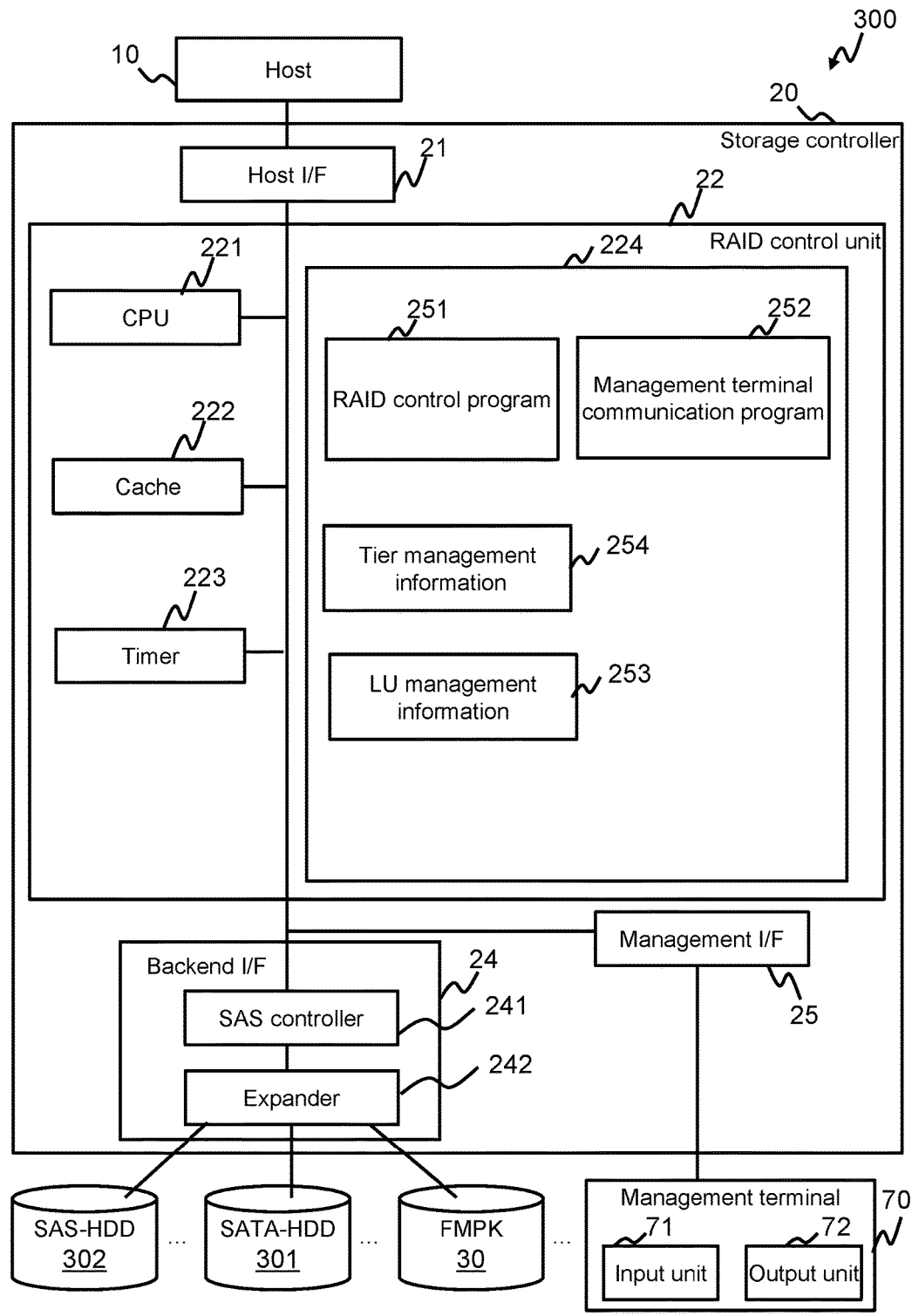
FIG. 4 illustrates a configuration of a storage apparatus 300.

FIG. 4 illustrates the configuration of the storage apparatus 300.

The storage apparatus 300 includes a storage controller 20 as an example of the host apparatus 20', an FMPK 30, an SAS-HDD 302, and a SATA (Serial ATA)-HDD 301. The number of at least one of the FMPK 30, the SAS-HDD 302, or the SATA-HDD 301 may be one or more. In this embodiment, the storage apparatus 300 may include a RAID group formed of a plurality of FMPKs 30, a RAID group formed of a plurality of SAS-HDDs 302, and a RAID group formed of a plurality of SATA-HDDs 301.

The host apparatus or storage controller 20 includes a host I/F 21, a RAID control unit 22, a management I/F 25, and a backend interface device (backend I/F) 24.

The host I/F 21 is a communication interface device configured to mediate communication of data between the host computer (hereinafter, host) 10 and the storage controller 20. The host 10 inputs and outputs data used for processing to and from the storage controller 20.

The management I/F 25 is a communication interface device configured to mediate communication of data with the management terminal 70. The management terminal 70 is a computer, and includes an input unit (for example, keyboard and pointing device) (not shown) configured to receive inputs from a user (for example, administrator) and an output unit (for example, display device) (not shown) configured to output (typically, display) information to the user. The input unit 71 and the output unit 72 may be integrated as exemplified by a touch panel.

The backend I/F 24 mediates communication of data with PDEVs such as the FMPK 30, the SAS-HDD 302, and the SATA-HDD 301. The backend I/F 24 includes a SAS controller 241 and a SAS expander (hereinafter expander) 242. The expander 242 is an example of a switch device. The expander 242 can be coupled to a plurality of PDEVs (30, 301, and 302), and mediates communication of data with the SAS controller 241 and the PDEVs. The SAS controller 241 communicates data with the PDEVs in accordance with the SAS protocol. The storage controller 20 and the PDEVs may communicate with each other by another protocol (for example, PCIe (PCI-Express)) other than the SAS protocol.

The RAID control unit 22 performs control for accessing the PDEV from the host 10. The RAID control unit 22 includes a CPU 221, a cache memory 222, a timer 223, and a memory 224. The cache memory 222 caches data to be input and output to and from the PDEV. The timer 223 measures the lapse of time. The CPU 221 executes various kinds of processing by using programs and data stored in the memory 224.

The memory 224 stores programs executed by the CPU 221 and data used by the CPU 221. Specifically, the memory 224 includes a RAID control program. 251 for performing RAID control on a RAID group, a management terminal communication program 252 for communicating with the management terminal 70, LU management information 253, and tier management information 254. The LU management information 253 has, for each LU, an LU ID (for example, LU number), an LU type (RLU or VLU), a capacity, and LU definitions (for example, use purpose, access type, and access pattern). The tier management information 254 has, for each virtual chunk in each VLU, an access frequency and an address of an allocated real chunk. The access frequency for a virtual chunk may be both of a first type of frequency with which data is updated for both of read and write and a second type of frequency (update frequency) with which data is updated only for write.

The RAID control program 251 can provide LUs, such as RLUs and VLUs, to the host 10. The RAID control program 251 issues a command to the FMPK 30 via the backend I/F 24. The RAID control program 251 manages the access frequency for each virtual chunk in the VLU by using the tier management information 254. The RAID control program allocates a real chunk from a pool to a write destination virtual chunk in the VLU. The pool has a tiered structure.

The RAID control program 251 determines that the update frequency of the virtual chunk is relatively high when the update frequency is within a first update frequency range, and determines that the update frequency of the virtual chunk is relatively low when the update frequency is within a second update frequency range that includes update frequencies lower than those in the first update frequency range. The RAID control program 251 stores the result of the determination in the tier management information 254.

Figure 5:
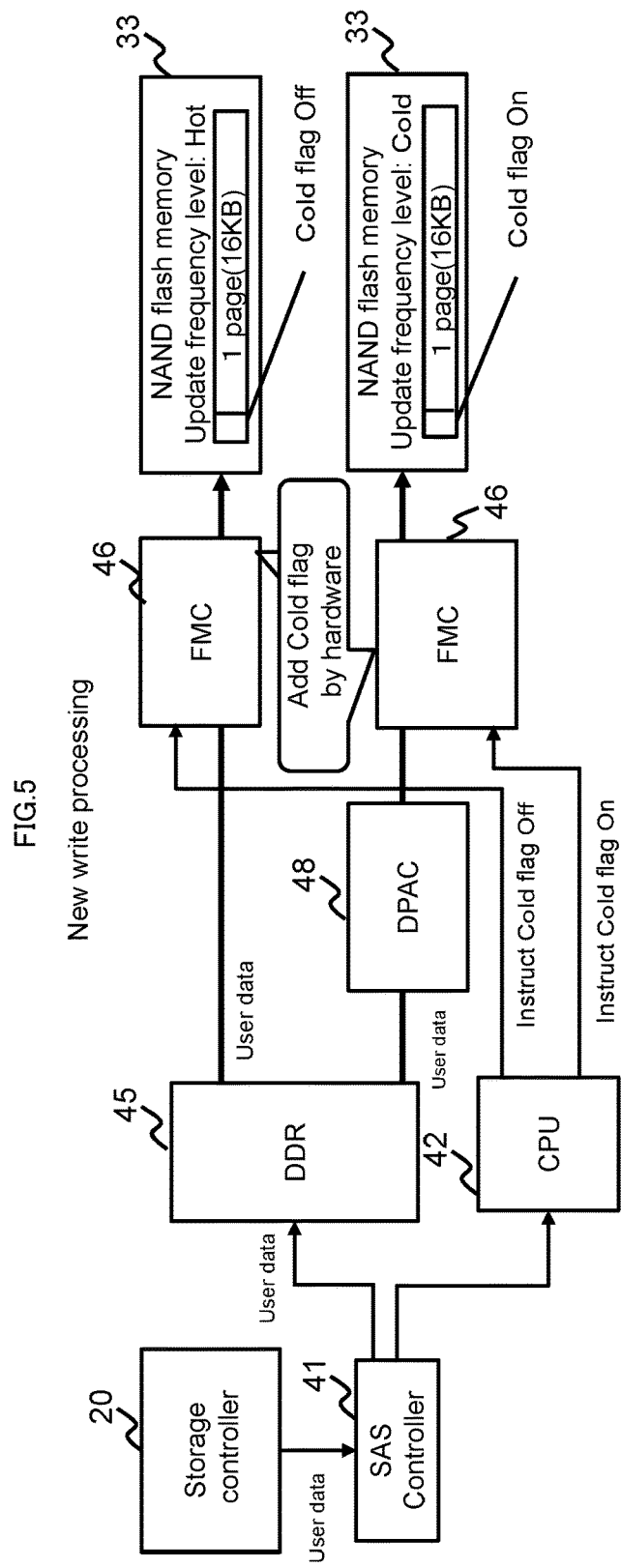
FIG. 5 illustrates block management information 453.

FIG. 5 illustrates the block management information 453.

The block management information 453 has an entry for each block. The entry for each block includes a block number (If) 1901, a read frequency 1902, a write start time 1903, a write end time 1904, and a degradation rank 1905.

The block number 1901 is information (physical block number or PBN) identifying the block. The read frequency 1902 represents a read frequency measured for the block. The write start time 1903 is the time at which the first physical page in the block is written. The write end time 1904 is the time at which the last physical page in the block is written. The last physical page in an uncompleted block is not written, and hence the write end time 1904 in this entry is an invalid value. The degradation rank 1905 represents either Young or Old.

The block management information 453 may include the physical block state (such as free and defective) and the degree of degradation in addition to the above.

The degradation rank may be updated as appropriate by the FM control program 442 in accordance with the updated degree of degradation.

In the case where the FMPK 30 measures the update frequency of every page and determines whether to compress data in accordance with the update frequency in order to determine whether to compress write data at the time the write data is received from the storage controller 20, if the update frequencies of all pages are stored in the high-speed memory 44 for the purpose of suppressing the influence on the performance, the capacity of the high-speed memory 44 is too large, which is not realistic. The FMPK 30 in this embodiment receives the update frequency level from the storage controller 20, and stores the update frequency level in the NAND-FM 33 for each logical page. Further, the FMPK 30 stores the RCM count corresponding to the update frequency in the NAND-FM 33 for each logical page. In this manner, the FMPK 30 can suppress the amount of use of the high-speed memory 44 for managing the update frequency.

Each physical page is not always required to store the update frequency level. In this case, the low-speed memory 45 may store the update frequency level for each logical page. Each physical page is not always required to store the reclamation counter. In this case, the low-speed memory 45 may store the RCM count for each logical page.

A method of managing the update frequency level is now described.

At the time of new write, the storage controller 20 notifies the FMPK 30 of the update frequency level of a logical address range in response to a write command.

Figure 6:
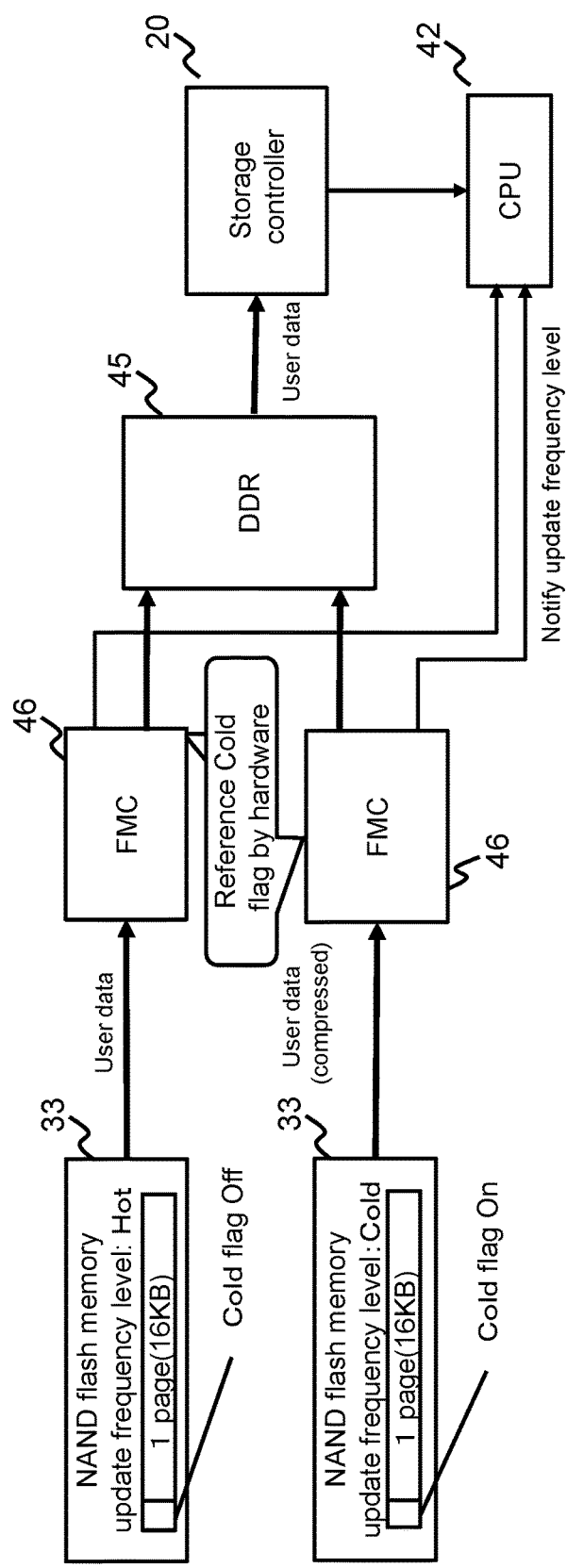
FIG. 6 illustrates new write processing using a storage controller and flash memory package (FMPK).

FIG. 6 illustrates new write processing using a storage controller and flash memory package (FMPK).

The RAID control program 251 (FIG. 4) in the storage controller 20 includes a command management program 261 and a device issuing program 262.

In the storage controller 20, when issuing a write command for new write, the command management program 261 determines whether the update frequency level of a logical address range including a write destination is Hot on the basis of the tier management information 254. The logical address range including the write destination may be an LU or a virtual chunk. For example, in the case where the tier management information 254 indicates the update frequency for each LU, the command management program 261 determines that the update frequency level of an LU including the write destination is Hot when the update frequency of the LU is relatively high in the tier management information 254. The tier management information 254 may store the update frequency level determined for each LU.

After that, the device issuing program 262 issues a write command (special command) including the update frequency level to the FMPK 30 as a write command for new write.

After the FMPK 30 receives the write command including the update frequency level from the storage controller 20, the device control program 443 specifies a target logical page corresponding to the target logical address range, receives write data, and transfers the target logical page number, the update frequency level, and the write data to the FM control program 442.

The FM control program 442 determines whether the update frequency level included in the write command is Hot. When it is determined that the update frequency level is Cold, the FM control program 442 compresses the write data to generate compressed data, selects a free page in a block having a degradation level of Old as a target physical page, allocates the target physical page to a target logical page, and writes the compressed data into the target physical page. When it is determined that the update frequency level is Hot, the FM control program 442 selects a free page in a block having a degradation level of Young as a target physical page, allocates the target physical page to a target logical page, and writes the write data into the target physical page without compressing the write data.

The new write processing described above enables the storage controller 20 to issue the write command including the update frequency level to the FMPK 30, thereby designating compression or non-compression of the write data. The FMPK 30 can determine whether to compress the write data at the time the write data is received from the storage controller 20. Further, data whose update frequency is relatively low is compressed and written, and data whose update frequency is relatively high is written in an uncompressed form, and hence the frequency of subsequent compression and expansion processing can be suppressed to improve the performance. A physical page in a block whose degree of degradation is relatively high (Old) is allocated to a logical page whose update frequency is relatively low (Cold), and a physical page in a block whose degree of degradation is relatively low (Young) is allocated to a logical page whose update frequency is relatively high (Hot), and hence the difference in degree of degradation among the plurality of blocks can be reduced to improve the life of the NAND-FM 33.

The storage controller 20 may determine the update frequency level of an LU on the basis of attributes of the LU (for example, at least one of the use purpose, access type, or access pattern). The attributes of the LU may be set in advance by a user.

Examples of options of the use purpose of the LU include a database, a system, user data, and a copy destination. Examples of options of the access type of the LU include a read main, a write main, and read/write. Examples of options of the access pattern of the LU include sequential, random, and sequential/random. On the basis of the LU definitions (options selected for each of at least one of the use purpose, the access type, or the access pattern) set by the management terminal 70, the storage controller 20 (or device controller 32) can determine the update frequency level of the whole LU. The input LU definitions are registered in, for example, the memory 224 in association with an LU ID such as an LU number. The input LU definitions are an example of the attributes of the logical address range. For an RLU, the logical address range corresponding to the entire range of the RLU is an example of the logical address range for the FMPK 30. The storage controller 20 manages a plurality of LUs, but the FMPK 30 side does not manage accesses for each LU and hence cannot recognize an access pattern for each LU.

The storage controller 20 determines the update frequency level on the basis of the attributes of the LU, and hence the FMPK 30 can allocate an appropriate block to a logical page corresponding to the LU, and the life and the performance of the memory can be improved.

The storage controller 20 may notify the FMPK 30 of the update frequency level of a particular logical address range in response to another notification command other than the write command.

The write command for new write is not always required to include the update frequency level. In this case, the FMPK 30 may set the update frequency level of the target logical page in the new write processing to Hot.

Figure 7:
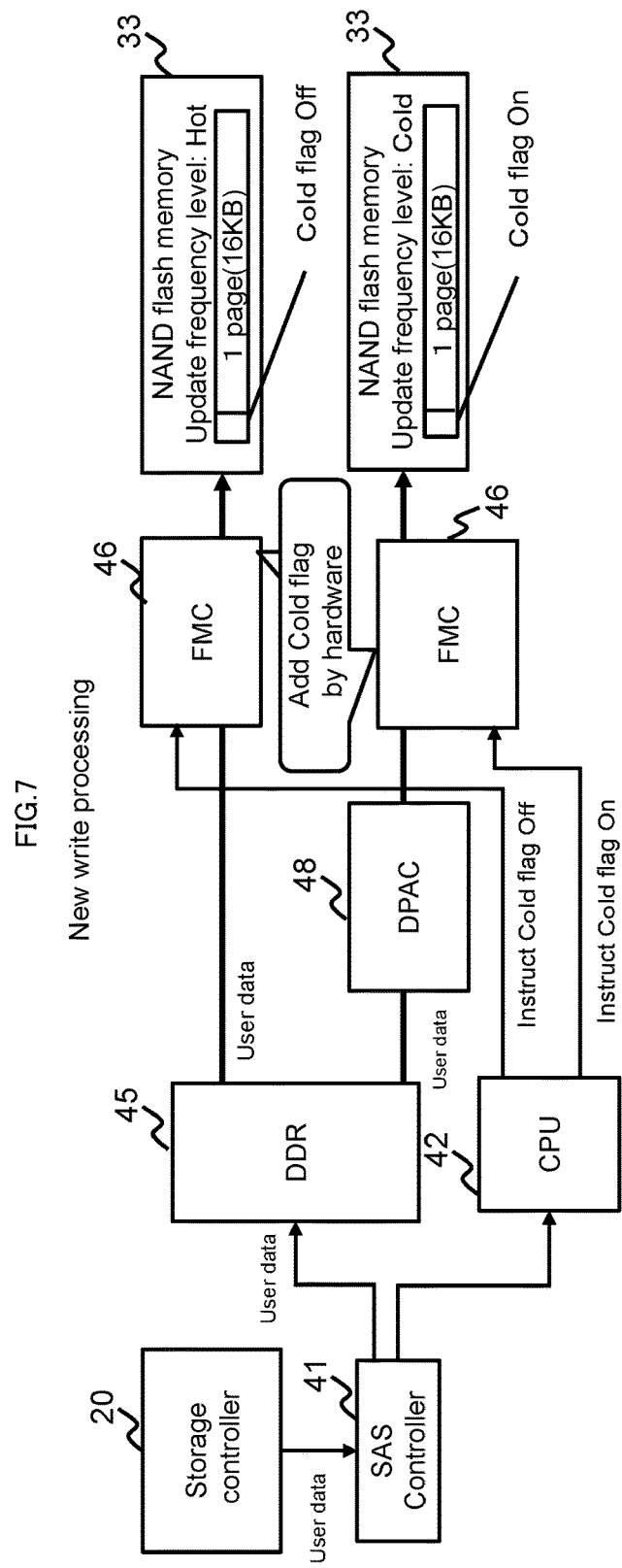
FIG. 7 shows a block diagram which illustrates a method of storing an update frequency level.

FIG. 7 shows a block diagram which illustrates a method of storing the update frequency level.

In the new write processing, when the SAS controller 41 receives a write command including the update frequency level from the storage controller 20, the SAS controller 41 transfers the contents of the write command to the CPU 42, and writes user data from the storage controller 20 into the low-speed memory 45.

The CPU 42 specifies a target physical page from the logical address range designated by the write command. The CPU 42 determines whether the update frequency level from the storage controller 20 is Cold.

When the update frequency level is Hot, the CPU 42 instructs the FMC 46 to write user data and a Cold flag indicating Off into the target physical page. In response to this instruction, the FMC 46 writes the Cold flag indicating Off and the user data into the target physical page in the NAND-FM 33.

When the update frequency level is Cold, the CPU 42 compresses user data by using the compression and expansion circuit DPAC 48, and instructs the FMC 46 to write the obtained compressed data and a Cold flag indicating On into the target physical page. In response to this instruction, the FMC 46 writes the Cold flag indicating On and the compressed data into the target physical page in the NAND-FM 33.

The method of storing the update frequency level described above enables the FMPK 30 to store the update frequency level from the storage controller 20 in the target physical page in the NAND-FM 33.

Figure 8:
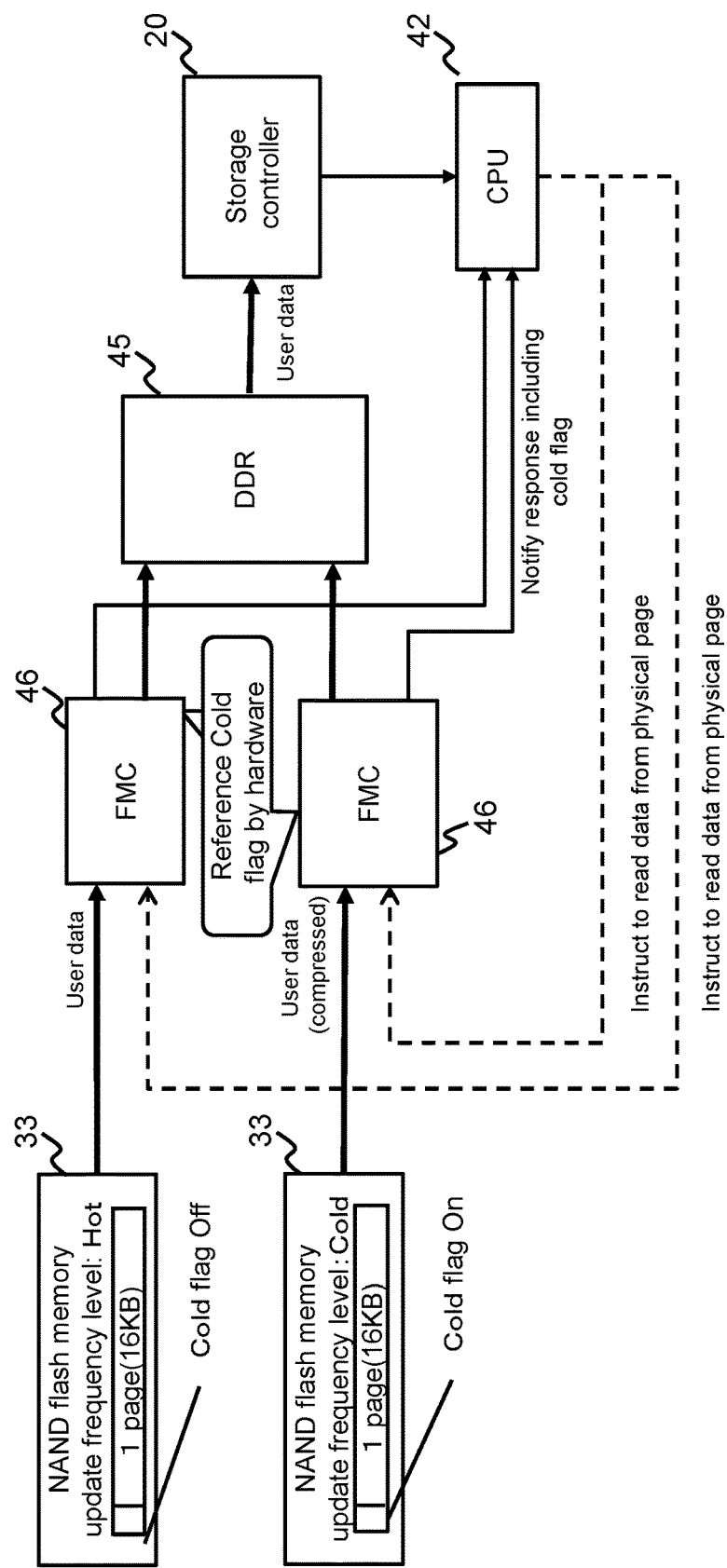
FIG. 8 shows a block diagram which illustrates a method of referencing the update frequency level.

FIG. 8 shows a block diagram which illustrates a method of referencing the update frequency level.

In the read processing, in response to the read command from the storage controller 20, the CPU 42 specifies a target physical page from the logical address range designated by the read command. The CPU 42 instructs the FMC 46 to read data from the target physical page. The FMC 46 reads a Cold flag and data from the target physical page, notifies the CPU 42 of a response including the read Cold flag, and reads the data from the target physical page to the low-speed memory 45.

The CPU 42 determines whether the notified Cold flag is On. When it is determined that the Cold flag is On, the CPU 42 uses the compression and expansion circuit DPAC 48 (not shown in FIG. 8) to expand the read data, and transfers the obtained user data from the low-speed memory 45 to the storage controller 20. When it is determined that the Cold flag is Off, the CPU 42 transfers the read user data from the low-speed memory 45 to the storage controller 20.

The method of referencing the update frequency level described above enables the FMPK 30 to read the update frequency level stored in the target physical page in the NAND-FM 33, thereby recognizing whether the data stored in the target physical page is compressed data.

A method of updating the update frequency level by I/O processing is now described.

The FMPK 30 updates the update frequency level of the target logical page through update write processing and read processing in the I/O processing.

Figure 9:
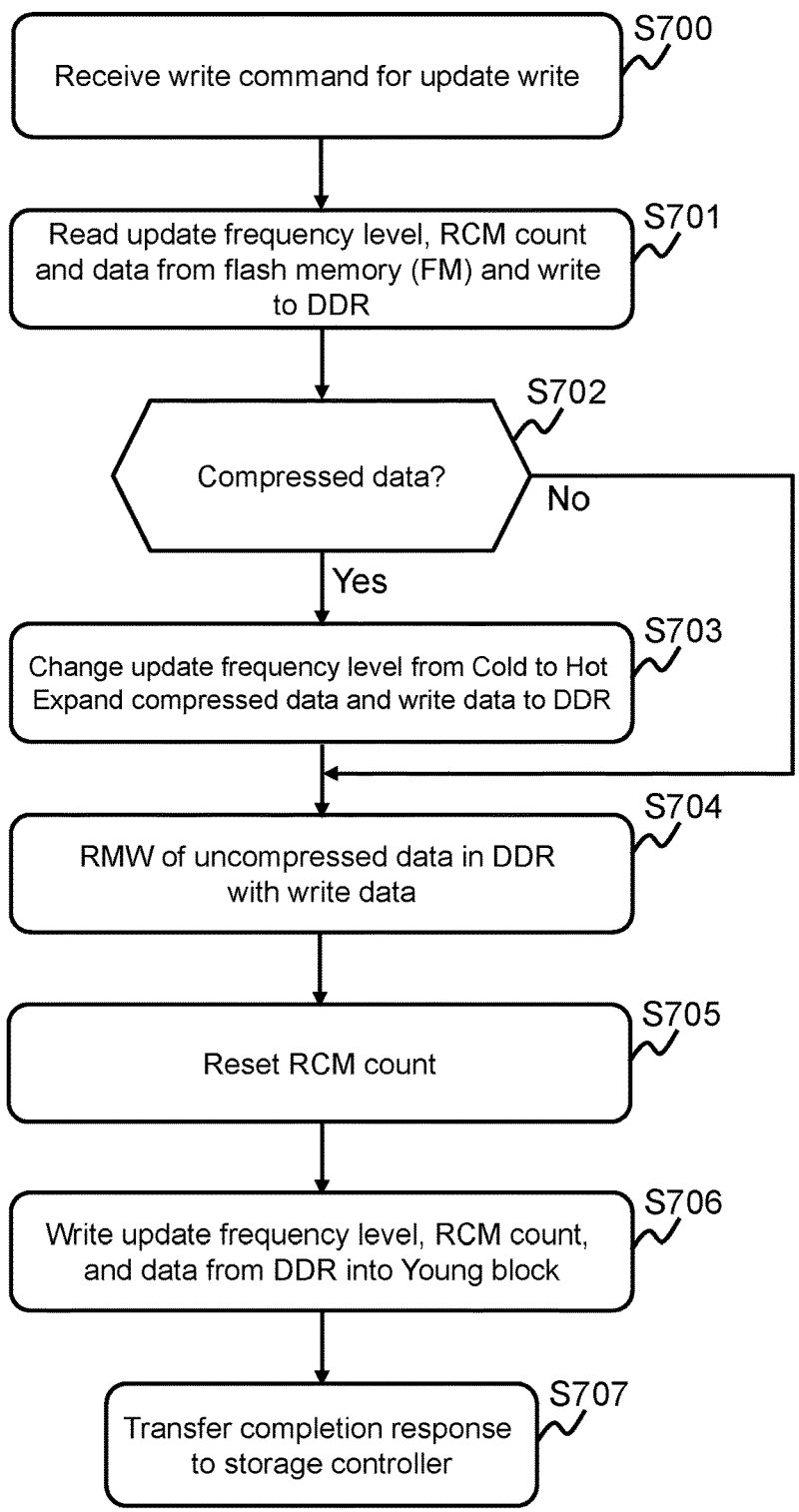
FIG. 9 illustrates update write processing.

FIG. 9 illustrates the update write processing.

In S700, the CPU 42 executes the update write processing when receiving a write command not including an update frequency level, as a write command for update write from the storage controller 20.

In S701, the CPU 42 specifies a target logical page of the write command, specifies a read target physical page corresponding to the target logical page, reads an update frequency level, an RCM count, and data from the read target physical page, and writes the update frequency level, the RCM count, and the data into the low-speed memory 45. In S702, the CPU 42 determines whether the read data is compressed data. The update frequency level read into the low-speed memory 45 indicates an update frequency level of a target logical page. When the update frequency level of the target logical page is Cold, the CPU 42 determines that the read data is compressed data.

When it is determined in S702 that the read data is uncompressed data (No), the CPU 42 proceeds the processing to S704.

When it is determined in S702 that the read data is compressed data (Yes), in S703, the CPU 42 changes the update frequency level of the target logical page from Cold to Hot, expands the compressed data, writes the obtained uncompressed data into the low-speed memory 45, and proceeds the processing to S704.

In S704, the CPU 42 performs RMW (Read Modify Write) for overwriting uncompressed data in the low-speed memory 45 with write data. After that, in S705, the CPU 42 initializes the RCM count of the target logical page to 0. After that, in S706, the CPU 42 selects a free page in a block having a degradation rank of Young as a write target physical page, and writes the update frequency level, the RCM count, and the overwritten uncompressed data in the low-speed memory 45 into the write target physical page.

In S707, the CPU 42 transmits a response of completion to the storage controller 20, and finishes this flow.

The update write processing described above enables the FMPK 30 to recognize that the update frequency level of the updated logical page is Hot, thereby preventing the occurrence of expansion and compression and accesses to blocks of Old caused by subsequent accesses to the logical page. Consequently, the performance and the life of the FMPK 30 can be improved.

Figure 10:
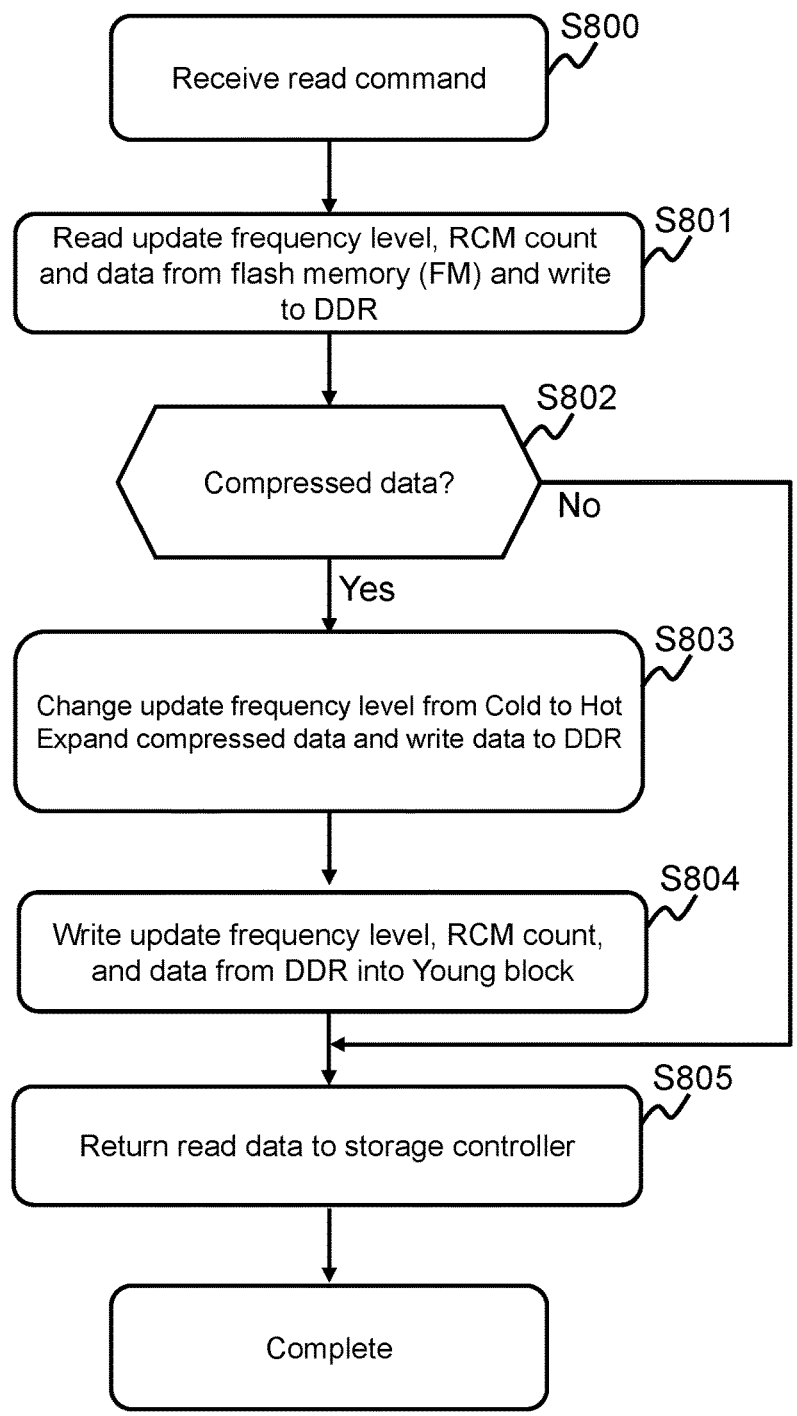
FIG. 10 illustrates read processing.

FIG. 10 illustrates read processing.

In S800, the CPU 42 executes the read processing when receiving a read command from the storage controller 20.

In S801, from the NAND-FM 33, the CPU 42 specifies a target logical page of read command, specifies a read target physical page corresponding to the target logical page, reads an update frequency level, an RCM count, and data from the read target physical page, and writes the update frequency level, the RCM count, and the data into the low-speed memory 45. In S802, the CPU 42 determines whether the read data is compressed data. The CPU 42 determines that the read data is compressed data when the update frequency level of the target logical page is Cold.

When it is determined in S802 that the read data is uncompressed data (No), the CPU 42 proceeds the processing to S805.

When it is determined in S802 that the read data is compressed data (Yes), in S803, the CPU 42 changes the update frequency level of the target logical page from Cold to Hot, expands the compressed data, and writes the obtained uncompressed data into the low-speed memory 45. In S804, the CPU 42 selects a free page in a block having a degradation rank of Young as a write target physical page, and writes the update frequency level, the RCM count, and the uncompressed data in the low-speed memory 45 into the write target physical page.

In S805, the CPU 42 transmits the uncompressed data in the low-speed memory 45 to the storage controller 20, and finishes this flow.

The read processing described above enables the FMPK 30 to recognize that the update frequency level of the read logical page is Hot, thereby preventing the occurrence of expansion and compression and accesses to blocks of Old caused by subsequent accesses to the logical page. Consequently, the performance and the life of the FMPK 30 can be improved.

In any one of the update write processing and the read processing, when the I/O command from the storage controller 20 includes the update frequency level, the FMPK 30 may determine the necessity of compression and a write destination block in accordance with the update frequency level similarly to the new write processing.

A method of managing the RCM count is now described.

Update of the RCM count by the reclamation processing #1 and #2 is described below.

Figure 11:
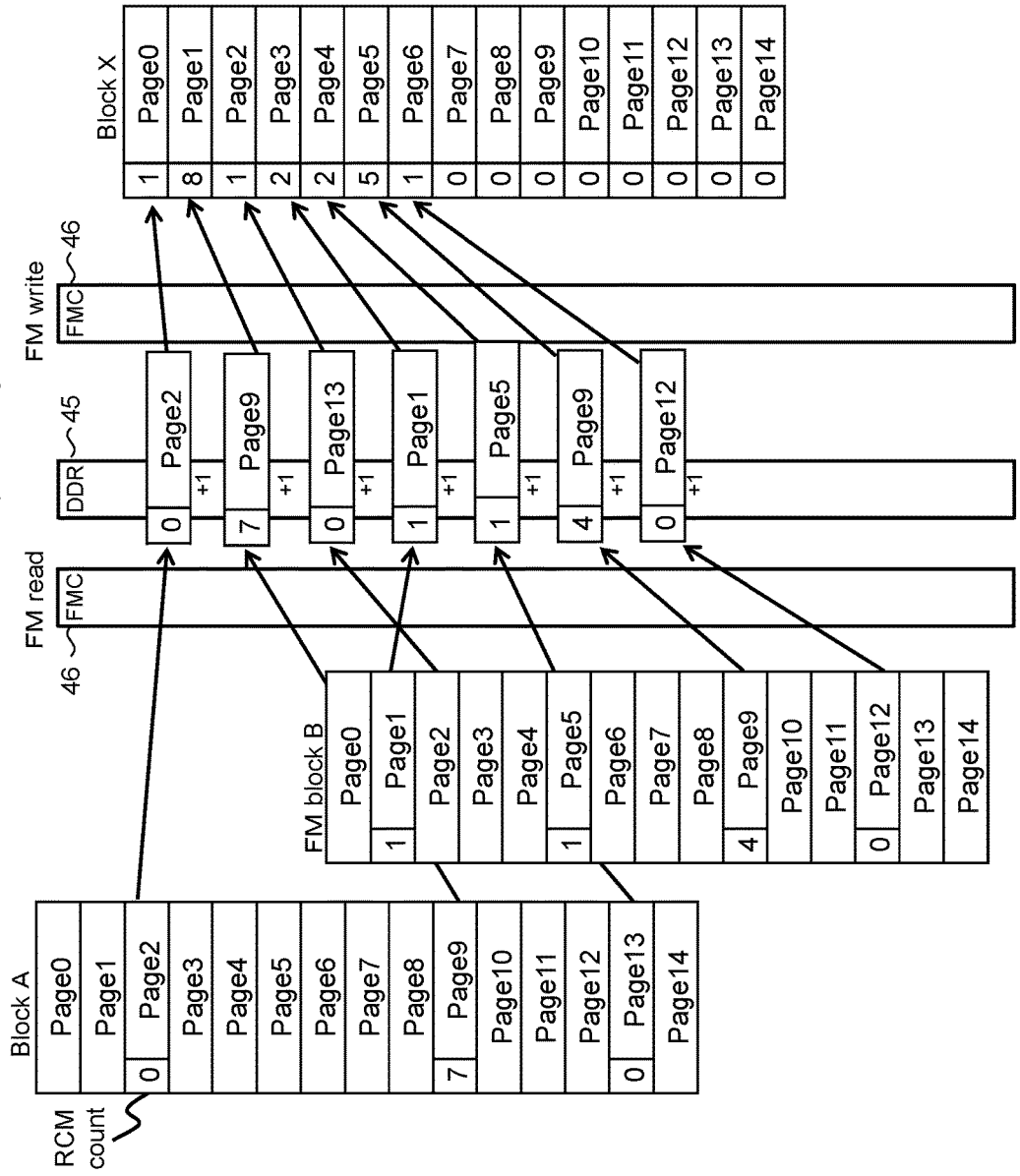
FIG. 11 illustrates reclamation processing #1.

FIG. 11 illustrates the reclamation processing #1.

In the reclamation processing #1, the CPU 42 selects a block A and a block B as migration source blocks, and selects a block X as a migration destination block. The CPU 42 migrates all valid data stored in the migration source blocks to the migration destination block. After that, the CPU 42 deletes the migration source blocks, and changes the migration source blocks to free blocks.

Prior to the reclamation processing #1, page 2, page 9, and page 13 among physical pages in the block A are valid pages, and the other physical pages are invalid pages. Page 1, page 5, page 9, and page 12 among physical pages in the block B are valid pages, and the other pages are invalid pages.

The CPU 42 instructs the FMC 46 to read an RCM count and valid data from each valid page in the migration source blocks to the low-speed memory 45 (FM read). After that, the CPU 42 adds 1 to the RCM count read to the low-speed memory 45 (+1 in FIG. 11). After that, the CPU 42 instructs the FMC 46 to write the RCM count and the valid data from the low-speed memory 45 into free pages in the migration destination block (FM write).

Figure 12:
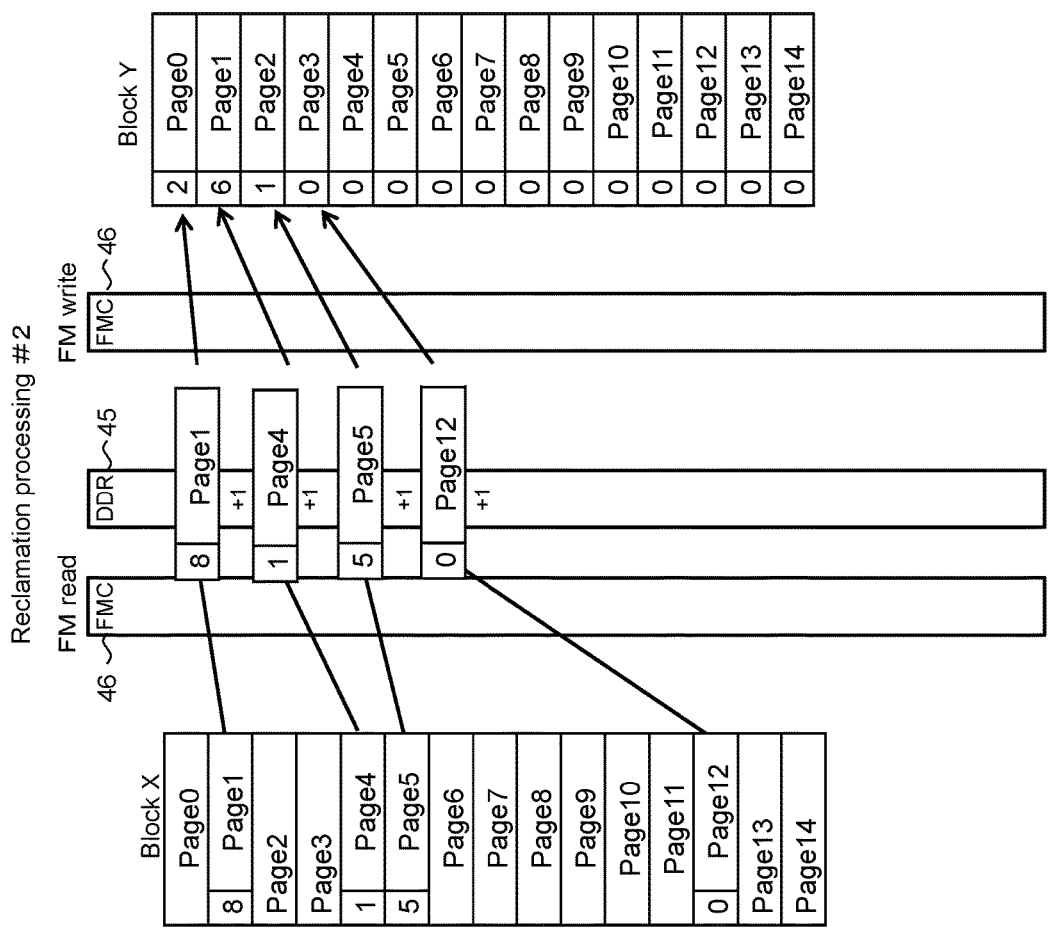
FIG. 12 illustrates reclamation processing #2.

FIG. 12 illustrates reclamation processing #2.

After time has elapsed from the reclamation processing #1, the CPU 42 executes reclamation processing according to a second specific example. In the reclamation processing according to the second specific example, the CPU 42 selects a block X as a migration source block, and selects a block Y as a migration destination block.

Prior to the reclamation processing #2, page 1, page 4, page 5, and page 12 among physical pages in the block X are valid pages, and the other physical pages are invalid pages.

In the reclamation processing #2, similarly to the reclamation processing #1, the CPU 42 uses the FMC 46 to read an RCM count and valid data from each valid page in the migration source block (FM read), adds 1 to the RCM count (+1 in FIG. 12), and writes the RCM count and the valid data into the migration destination block (FM write).

The reclamation processing described above enables the RCM count taking the update frequency into consideration to be measured for each logical page. The RCM count is stored in the physical page in the NAND-FM 33, and hence the load on the low-speed memory 45 can be suppressed. In the reclamation processing, a logical page whose RCM count exceeds the RCM count threshold can be determined as a logical page whose update frequency is relatively low (Cold).

Details of the reclamation processing are now described.

Figure 13:
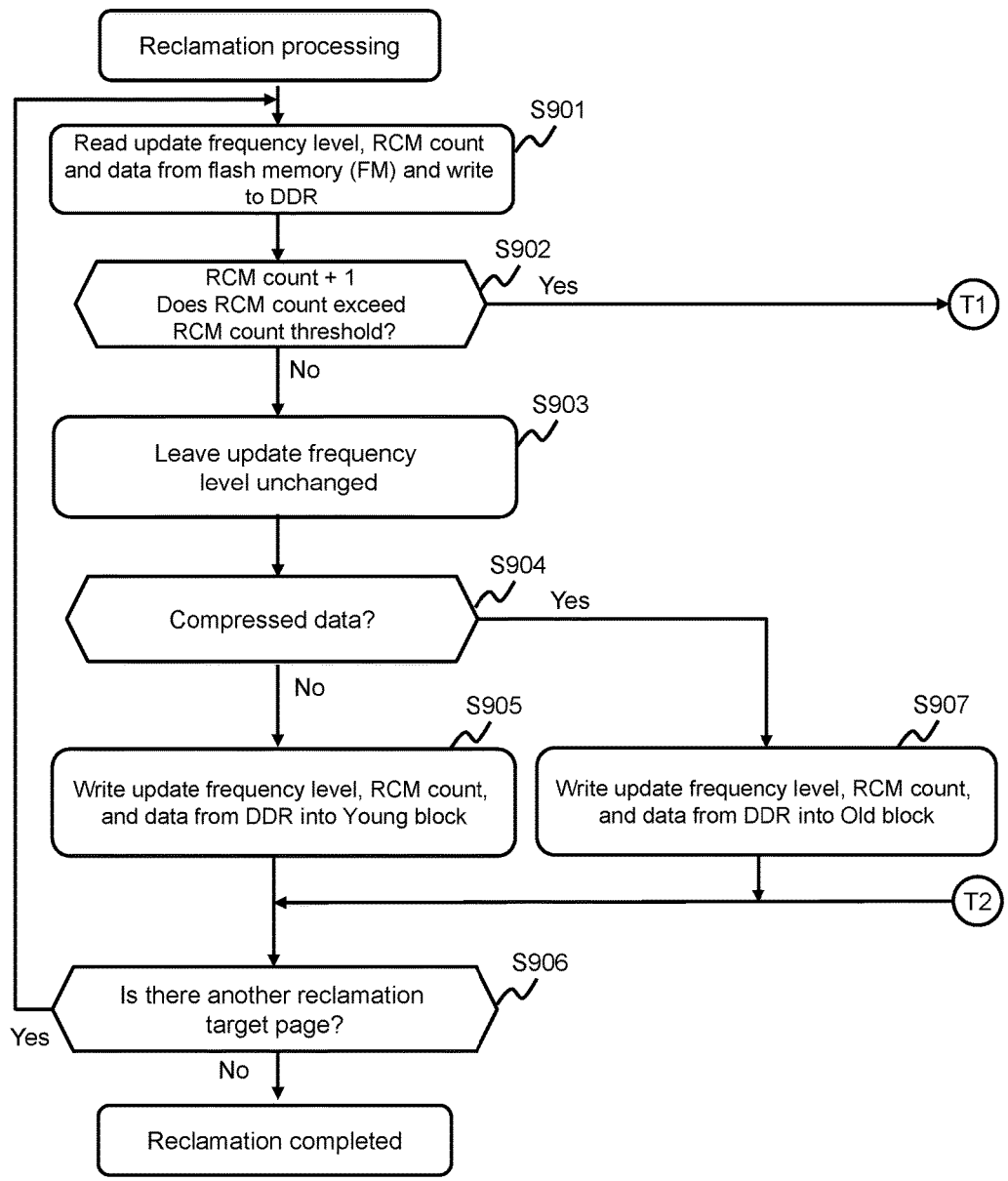
FIG. 13 illustrates a first part of each of the reclamation processing #1 and reclamation processing #2.
Figure 14:
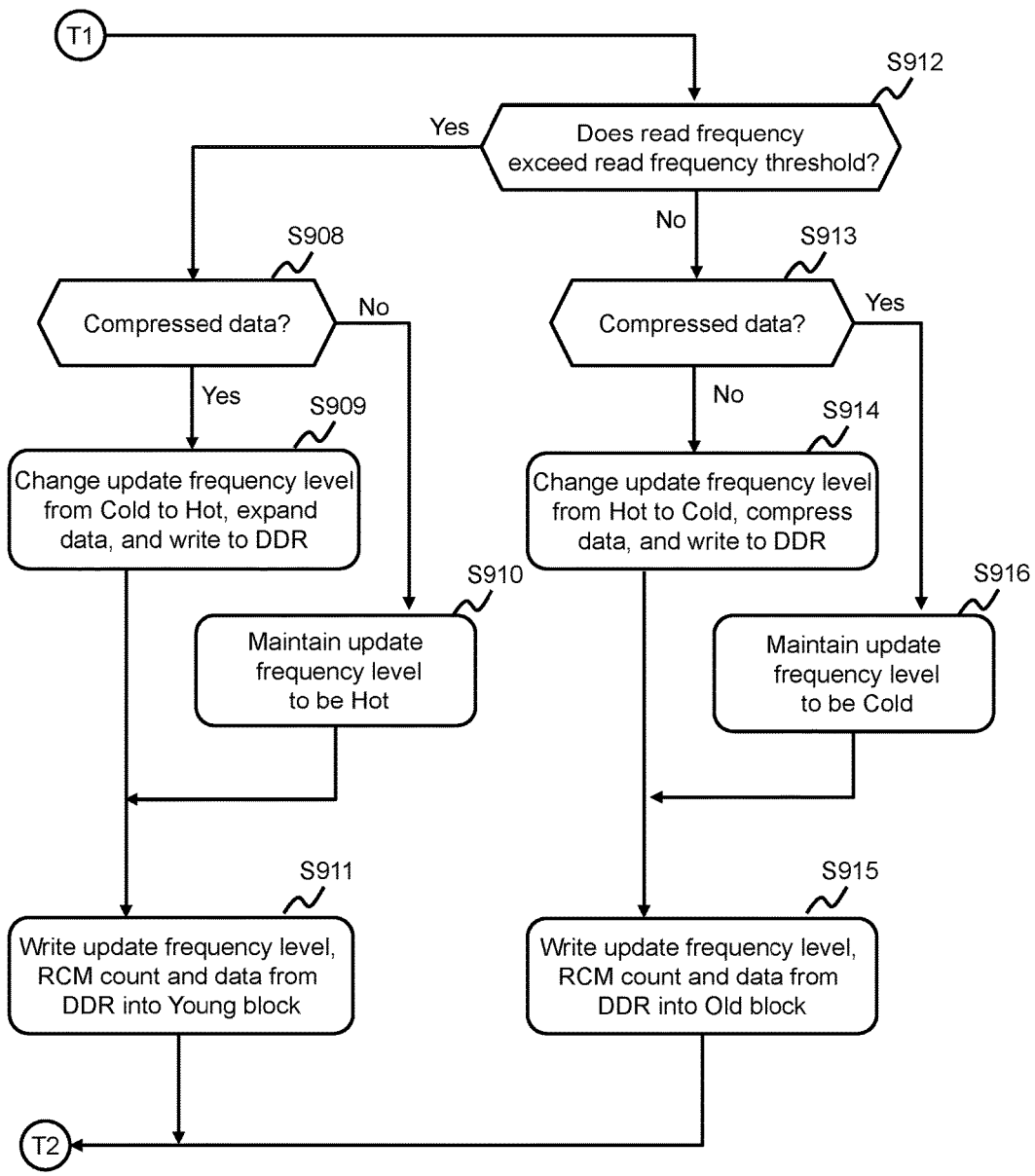
FIG. 14 illustrates a second part of each of the reclamation processing #1 and reclamation processing #2.

FIG. 13 illustrates a first part of the reclamation processing. FIG. 14 illustrates a second part of the reclamation processing.

In S901, the CPU 42 specifies a reclamation target page that is a physical page of a reclamation target within the NAND-FM 33, and reads an update frequency level, an RCM count, and data from the reclamation target page to the low-speed memory 45. After that, in S902, the CPU 42 adds 1 to the RCM count stored in the low-speed memory 45, and determines whether the RCM count is larger than an RCM count threshold set in advance.

When it is determined in S902 that the RCM count is larger than the RCM count threshold (Yes), the CPU 42 proceeds the processing to S912 (T1) in FIGS. 13, 14.

When it is determined in S902 that the RCM count is equal to or smaller than the RCM count threshold (No), the CPU 42 proceeds the processing to S903.

In S903, the CPU 42 does not change the update frequency level of the reclamation target page. After that, in S904, the CPU 42 determines whether the read data is compressed data.

When it is determined in S904 that the read data is uncompressed data (No), in S905, the CPU 42 selects a free page in a block having a degradation rank of Young as a write target page, writes the update frequency level, the RCM count, and the uncompressed data in the low-speed memory 45 to a write target page, allocates the write target page to a logical page allocated with the reclamation target page, and proceeds the processing to S906.

When it is determined in S904 that the read data is compressed data (Yes), in S907, the CPU 42 selects a free page in a block having a degradation rank of Old as a write target page, writes the update frequency level, the RCM count, and the compressed data in the low-speed memory 45 to the write target page, allocates a logical page allocated with the reclamation target page to the write target page, and proceeds the processing to S906.

In S906 (T2), the CPU 42 determines whether there is another reclamation target page. When it is determined in S906 that there are no other reclamation target pages (No), the CPU 42 finishes this flow. When it is determined in S906 that there is another reclamation target page (Yes), the CPU 42 proceeds the processing to S901, and selects another reclamation target page.

In S912 (T1, FIG. 14), the CPU 42 determines, on the basis of the block management information 453, whether the read frequency of the block including the reclamation target page is larger than a read frequency threshold determined in advance.

When it is determined in S912 that the read frequency is larger than the read frequency threshold (Yes), in S908, the CPU 42 determines whether the read data is compressed data.

When it is determined in S908 that the read data is compressed data (Yes), in S909, the CPU 42 changes the update frequency level of the reclamation target page from Cold to Hot, expands the compressed data, writes the obtained uncompressed data into the low-speed memory 45, and proceeds the processing to S911.

When it is determined in S908 that the read data is uncompressed data (No), in S910, the CPU 42 maintains the update frequency level of the reclamation target page to be Hot, and proceeds the processing to S911.

In S911, the CPU 42 selects a free page in a block having a degradation rank of Young as a write target page, writes the update frequency level, the RCM count, and the uncompressed data in the low-speed memory 45 to the write target page, allocates the write target page to a logical page allocated with the reclamation target page, and proceeds the processing to S906 (T1, FIGS. 14 and 13).

When it is determined in S912 that the read frequency does not exceed a read frequency threshold (No), in S913, the CPU 42 determines whether the read data is compressed data.

When it is determined in S913 that the read data is uncompressed data (No), in S914, the CPU 42 changes the update frequency level of the reclamation target page from Hot to Cold, compresses the uncompressed data, writes the obtained compressed data into the low-speed memory 45, and proceeds the processing to S915.

When it is determined in S913 that the read data is compressed data (Yes), in S916, the CPU 42 maintains the update frequency level of the reclamation target page to be Cold, and proceeds the processing to S915.

In S915, the CPU 42 selects a free page in a block having a degradation rank of Old as a write target page, writes the update frequency level, the RCM count, and the compressed data in the low-speed memory 45 to the write target page, allocates the write target page to a logical page allocated with the reclamation target page, and proceeds the processing to S906 (T2).

The reclamation processing described above enables the FMPK 30 to update the RCM count of the logical page corresponding to the reclamation target page, thereby determining the update frequency level in accordance with the RCM count and the read frequency. Consequently, the FMPK 30 can set Hot to the update frequency level of a logical page whose update frequency is relatively low and read frequency is relatively high, and set Cold to the update frequency level of a logical page whose update frequency is relatively low and read frequency is relatively low. In the reclamation processing, the FMPK 30 determines the update frequency level of the logical page, and hence, when the update frequency level of the logical page has changed from that at the time of new write, the FMPK 30 can set an appropriate update frequency level to the logical page, and allocate the logical page to a block having an appropriate degradation rank.

Note that, in S912, the CPU 42 may determine whether the read frequency satisfies a read frequency condition determined in advance. For example, when no read disturb is detected in the reclamation target page, the CPU 42 may determine that the read frequency satisfies the read frequency condition.

The refresh processing is now described.

The CPU 42 executes refresh processing at the time of occurrence of errors set in advance, such as a write error and an uncollectable error, or regularly.

Figure 15:
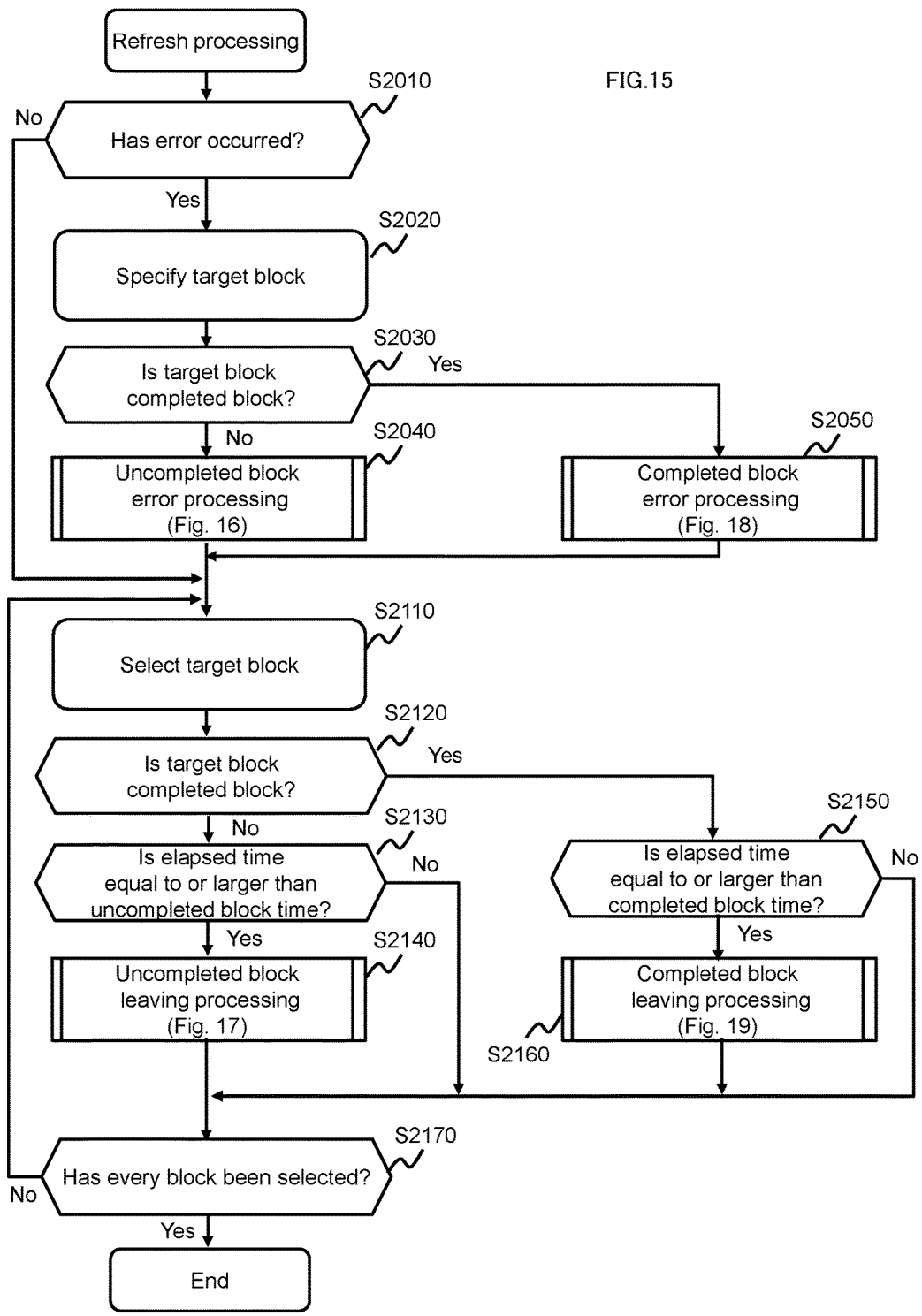
FIG. 15 illustrates refresh processing.

FIG. 15 illustrates the refresh processing.

In S2010, the CPU 42 determines whether an error has occurred in the NAND-FM 33.

When it is determined in S2010 that an error has occurred (Yes), in S2020, the CPU 42 specifies a block in which the error has occurred as a target block, and specifies a physical page in which the error has occurred as a migration target page. In S2030, the CPU 42 determines whether the target block is a completed block.

When it is determined in S2030 that the target block is not a completed block (No), in S2040, the CPU 42 executes uncompleted block error processing, and finishes this flow. When it is determined in S2030 that the target block is a completed block (Yes), in S2050, the CPU 42 executes completed block error processing, and finishes this flow.

When it is determined in S2010 that no error has occurred (No), in S2110, the CPU 42 selects blocks in the NAND-FM 33 as target blocks in order. In S2120, the CPU 42 determines whether the target block is a completed block.

When it is determined in S2120 that the target block is not a completed block (No), in S2130, the CPU 42 determines whether an elapsed time from a write start time of the target block is equal to or longer than an uncompleted block time (first time) set in advance. When it is determined in S2130 that the elapsed time is shorter than the uncompleted block time (No), the CPU 42 proceeds the processing to S2170. When it is determined in S2130 that the elapsed time is equal to or longer than the uncompleted block time (Yes), in S2140, the CPU 42 executes uncompleted block leaving processing, and proceeds the processing to S2170.

When it is determined in S2120 that the target block is a completed block (Yes), in S2150, the CPU 42 determines an elapsed time from the write start time of the target block is equal to or longer than a completed block time (second time) set in advance. When it is determined in S2150 that the elapsed time is shorter than the completed block time (No), the CPU 42 proceeds the processing to S2170. When it is determined in S2150 that the elapsed time is equal to or longer than the completed block time (Yes), in S2160, the CPU 42 executes completed block leaving processing, and proceeds the processing to S2170.

In S2170, the CPU 42 determines whether all blocks in the NAND-FM 33 have been selected. When it is determined in S2170 that all blocks have been selected (Yes), the CPU 42 finishes this flow. When it is determined in S2170 that all blocks have not been selected yet (No), the CPU 42 proceeds the processing to S2110, and selects the next target block.

In the NAND-FM, in general, the number of error bits increases along with the lapse of time from the write of data, and when the number of error bits increases to an uncorrectable number, an uncorrectable error occurs. In other words, the occurrence of an uncorrectable error means that a long time has elapsed from the write of data.

Errors are more liable to occur in an uncompleted block than in a completed block. Thus, the uncompleted block time may be shorter than the completed block time.

The refresh processing described above enables appropriate processing to be selected depending on whether an error has occurred or whether a predetermined time has elapsed.

Further, the refresh processing described above enables appropriate processing to be selected depending on whether a target block is an uncompleted block or a completed block.

Figure 16:
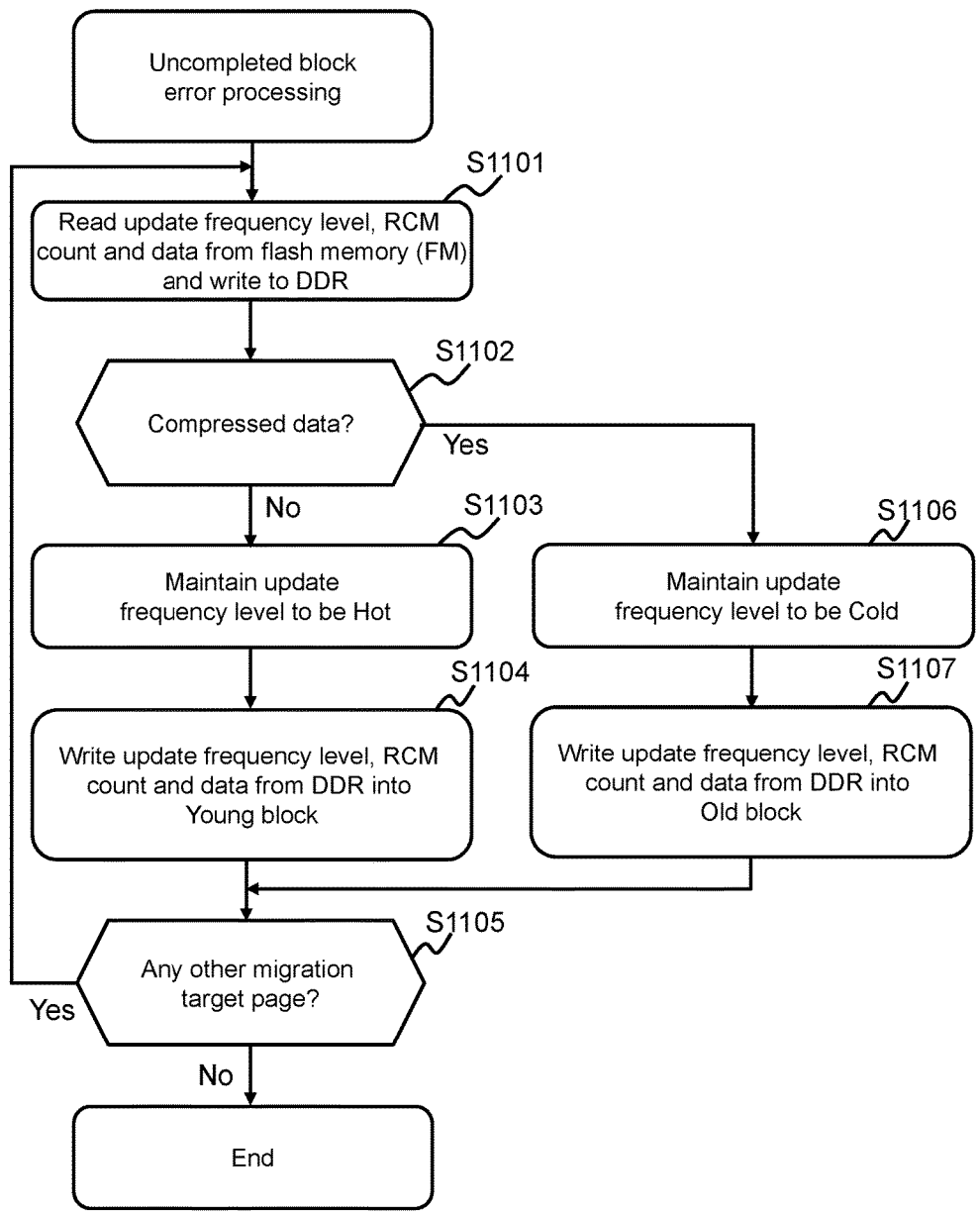
FIG. 16 illustrates uncompleted block error processing.

FIG. 16 illustrates the uncompleted block error processing.

In S2040 (FIG. 15) described above, the CPU 42 starts the uncompleted block error processing. In S1101 (FIG. 16), the CPU 42 selects valid pages in the uncompleted block as migration target pages in order, and reads an update frequency level, an RCM count, and data from the migration target page to the low-speed memory 45. After that, in S1102, the CPU 42 determines whether the read data is compressed data.

When it is determined in S1102 that the read data is uncompressed data (No), in S1103, the CPU 42 maintains the update frequency level of the migration target page to be Hot. After that, in S1104, the CPU 42 selects a free page in a block having a degradation rank of Young as a write target page, writes the update frequency level, the RCM count, and the uncompressed data in the low-speed memory 45 to the write target page, allocates the write target page to a logical page allocated with the reclamation target page, and proceeds the processing to S1105.

When it is determined in S1102 that the read data is compressed data (Yes), in S1106, the CPU 42 maintains the update frequency level of the migration target page to be Cold. After that, in S1107, the CPU 42 selects a free page in a block having a degradation rank of Old as a write target page, writes the update frequency level, the RCM count, and the compressed data in the low-speed memory 45 to the write target page, allocates the write target page to a logical page allocated with the reclamation target page, and proceeds the processing to S1105.

In S1105, the CPU 42 determines whether there is another migration target page. When it is determined in S1105 that there are no other migration target pages (No), the CPU 42 finishes this flow. When it is determined in S1105 that there is another migration target page (Yes), the CPU 42 proceeds the processing to S1101, and selects another migration target page.

Figure 17:
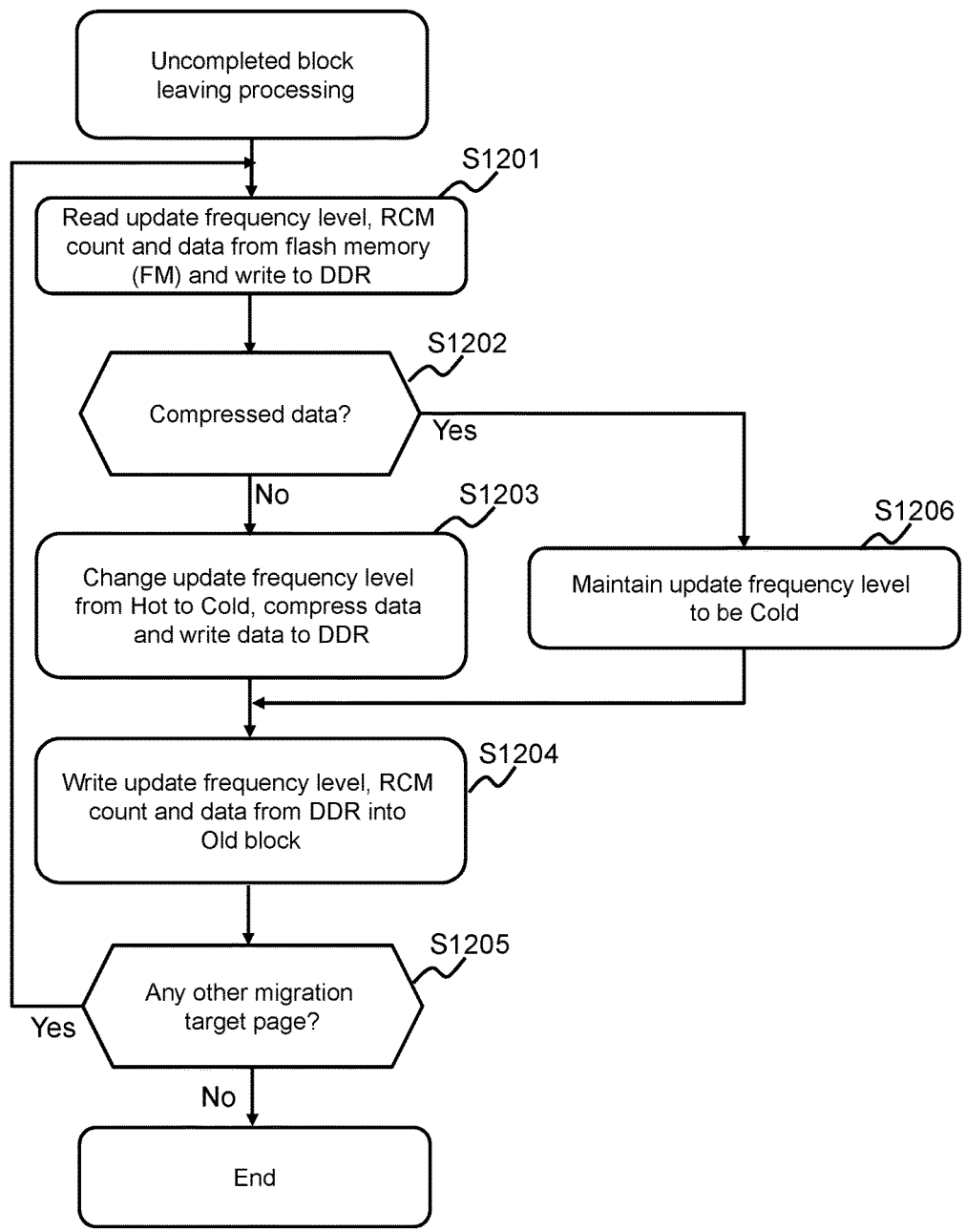
FIG. 17 illustrates uncompleted block leaving processing.

FIG. 17 illustrates the uncompleted block leaving processing.

In S2140 (FIG. 15) described above, the CPU 42 starts the uncompleted block leaving processing. In S1201 (FIG. 17), the CPU 42 selects valid pages in the block as migration target pages in order, and reads an update frequency level, an RCM count, and data from the migration target page to the low-speed memory 45. After that, in S1202, the CPU 42 determines whether the read data is compressed data.

When it is determined in S1202 that the read data is uncompressed data (No), in S1203, the CPU 42 changes the update frequency level of the migration target page from Hot to Cold, compresses the uncompressed data, and writes the obtained compressed data into the low-speed memory 45. After that, in S1204, the CPU 42 selects a free page in a block having a degradation rank of Old as a write target page, writes the update frequency level, the RCM count, and the compressed data in the low-speed memory 45 to the write target page, allocates the write target page to a logical page allocated with the reclamation target page, and proceeds the processing to S1205.

When it is determined in S1202 that the read data is compressed data (Yes), in S1206, the CPU 42 maintains the update frequency level of the migration target page to be Cold, and proceeds the processing to S1204.

In S1205, the CPU 42 determines whether there is another migration target page. When it is determined in S1205 that there are no other migration target pages (No), the CPU 42 finishes this flow. When it is determined in S1205 that there is another migration target page (Yes), the CPU 42 proceeds the processing to S1201, and selects another migration target page.

Figure 18:
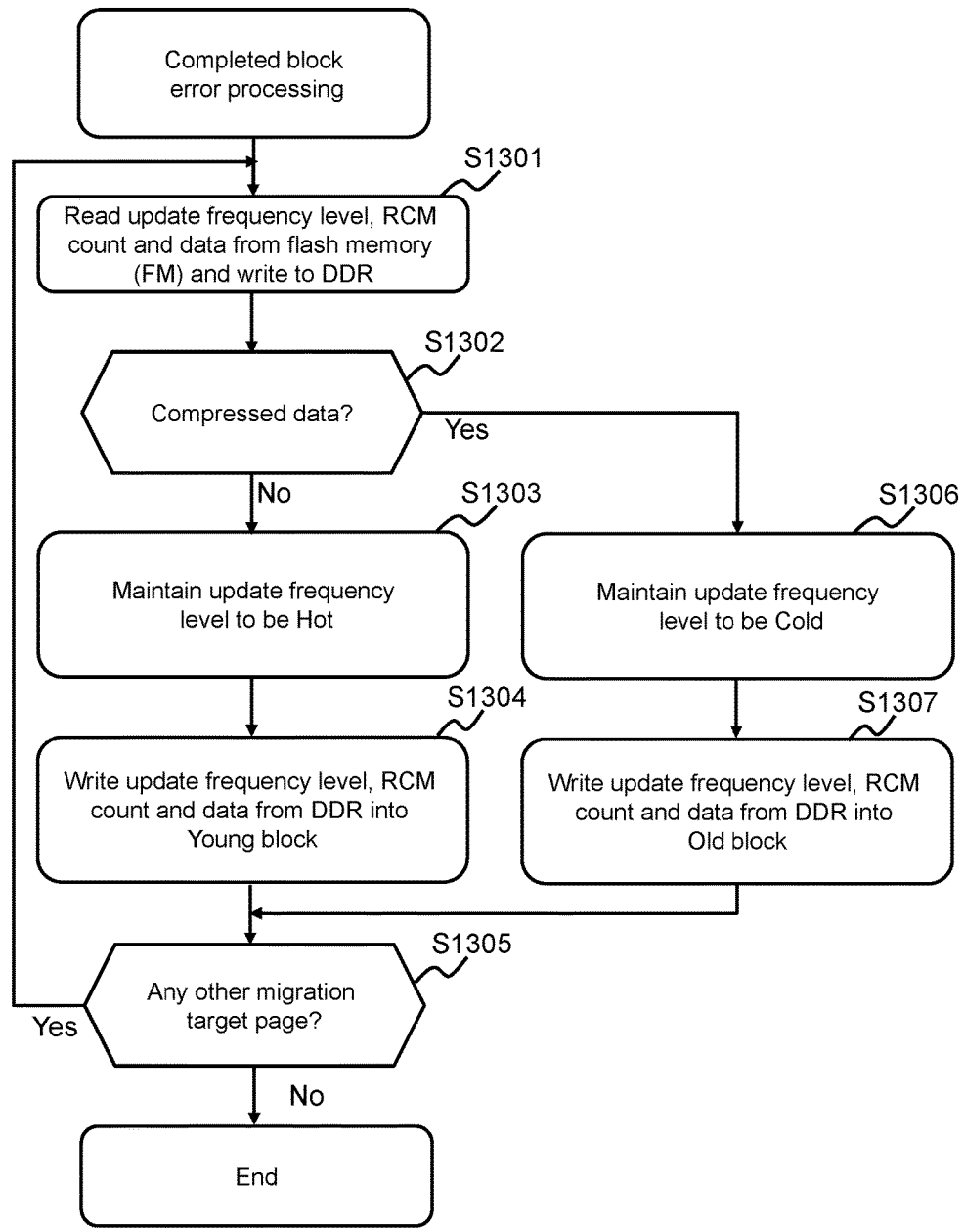
FIG. 18 illustrates completed block error processing.

FIG. 18 illustrates the completed block error processing.

In S2050 (FIG. 15) described above, the CPU 42 starts the completed block error processing. In S1301 (FIG. 18), the CPU 42 selects valid pages in the completed block as migration target pages in order, and reads an update frequency level, an RCM count, and data from the migration target page to the low-speed memory 45. After that, in S1302, the CPU 42 determines whether the read data is compressed data.

When it is determined in S1302 that the read data is uncompressed data (No), in S1303, the CPU 42 maintains the update frequency level of the migration target page to be Hot. After that, in S1304, the CPU 42 selects a free page in a block having a degradation rank of Young as a write target page, writes the update frequency level, the RCM count, and the uncompressed data in the low-speed memory 45 to the write target page, allocates the write target page to a logical page allocated with the reclamation target page, and proceeds the processing to S1305.

When it is determined in S1302 that the read data is compressed data (Yes), in S1306, the CPU 42 maintains the update frequency level of the migration target page to be Cold. After that, in S1307, the CPU 42 selects a free page in a block having a degradation rank of Old as a write target page, writes the update frequency level, the RCM count, and the compressed data in the low-speed memory 45 to the write target page, allocates the write target page to a logical page allocated with the reclamation target page, and proceeds the processing to S1305.

In S1305, the CPU 42 determines whether there is another migration target page. When it is determined in S1305 that there are no other migration target pages (No), the CPU 42 finishes this flow. When it is determined in S1305 that there is another migration target page (Yes), the CPU 42 proceeds the processing to S1301, and selects another migration target page.

Figure 19:
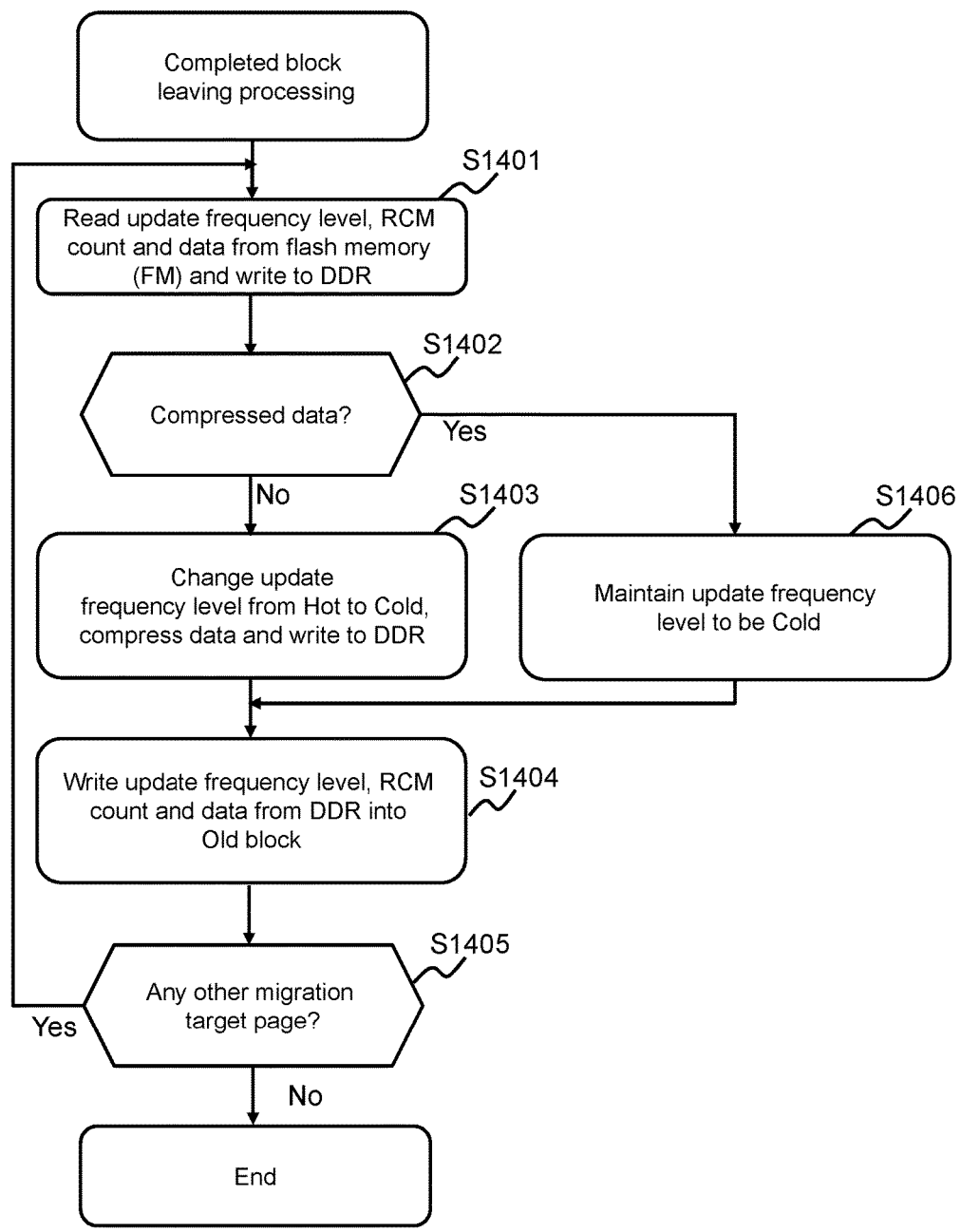
FIG. 19 illustrates completed block leaving processing.

FIG. 19 illustrates the completed block leaving processing.

In S2160 (FIG. 15) described above, the CPU 42 starts the completed block leaving processing. In S1401 (FIG. 19), the CPU 42 selects valid pages in the block as migration target pages in order, and reads an update frequency level, an RCM count, and data from the migration target page to the low-speed memory 45. After that, in S1402, the CPU 42 determines whether the read data is compressed data.

When it is determined in S1402 that the read data is uncompressed data (No), in S1403, the CPU 42 changes the update frequency level of the migration target page from Hot to Cold, compresses the uncompressed data, and writes the obtained compressed data into the low-speed memory 45. After that, in S1404, the CPU 42 selects a free page in a block having a degradation rank of Old as a write target page, writes the update frequency level, the RCM count, and the compressed data in the low-speed memory 45 to the write target page, allocates the write target page to a logical page allocated with the reclamation target page, and proceeds the processing to S1405.

When it is determined in S1402 that the read data is compressed data (Yes), in S1406, the CPU 42 maintains the update frequency level of the migration target page to be Cold, and proceeds the processing to S1404.

In S1405, the CPU 42 determines whether there is another migration target page. When it is determined in S1405 that there are no other migration target pages (No), the CPU 42 finishes this flow. When it is determined in S1405 that there is another migration target page (Yes), the CPU 42 proceeds the processing to S1401, and selects another migration target page.

In this embodiment, the uncompleted block error processing is similar to the completed block error processing. In this case, in the refresh processing, the CPU 42 is not always required to execute the determination in S2030 (FIG. 15).

In this embodiment, the uncompleted block leaving processing is similar to the completed block leaving processing. In this case, in the refresh processing, the CPU 42 is not always required to execute the determination in S2120. Note that the uncompleted block leaving processing may be different from the completed block leaving processing. For example, in S1203 (FIG. 17) in the uncompleted block leaving processing, the CPU 42 may maintain the update frequency level of the migration target page to be Hot. In this case, the CPU 42 selects a free page in a block having a degradation rank of Young as a write target page, writes the update frequency level, the RCM count, and the uncompressed data in the low-speed memory 45 to the write target page, and allocates the write target page to a logical page allocated with the reclamation target page. As described above, the uncompleted block time is shorter than the completed block time, and hence the uncompleted block leaving processing occurs more frequently than the completed block leaving processing does. Logical pages of Hot can be collected to a block of Young to reduce the time of compression in the uncompleted block time, thereby reducing subsequent uncompleted block leaving processing.

Differences in operation depending on operation conditions in the refresh processing are now described.

FIG. 20 illustrates a list of operations of the refresh processing.

The refresh processing determines an operation in accordance with operation conditions indicated by a number (#)1501. The operation conditions include a "state of block" 1502 and a trigger 1503 of the refresh processing. The refresh processing determines an update frequency level 1504 of a migration target page in the target block and determines a degradation rank 1505 of a corresponding migration destination block in accordance with the operation conditions.

When the target block is an uncompleted block and the trigger is a write error or an uncorrectable error of the target block, uncompleted block error processing is executed. The uncompleted block error processing does not change the update frequency level but writes data read from the migration target page in the target block into a block having a degradation rank corresponding to the update frequency level of the migration target page.

When the target block is an uncompleted block and the trigger is the fact that the elapsed time of the target block is equal to or larger than an uncompleted block time (an uncompleted block time or more has elapsed from the write start time of the target block), uncompleted block leaving processing is executed. The uncompleted block leaving processing changes the update frequency level of the migration target page to Cold when the update frequency level is Hot. In this manner, in the uncompleted block leaving processing, data stored in the migration target page is compressed, and the compressed data is written into a block having a degradation rank of Old.

When the target block is a completed block and the trigger is an uncorrectable error of the target block, completed block error processing is executed. The completed block error processing does not change the update frequency level but writes data from the migration target page in the target block into a block having a degradation rank corresponding to the update frequency level of the migration target page.

When the target block is a completed block and the trigger is the fact that the elapsed time of the target block is equal to or larger than a completed block time (a completed block time or more has elapsed from the write start time of the target block), completed block leaving processing is executed. The completed block leaving processing changes the update frequency level of the migration target page to Cold when the update frequency level is Hot. In this manner, in the completed block leaving processing, data stored in the migration target page is compressed, and the compressed data is written into a block having a degradation rank of Old.

The refresh processing described above enables the FMPK 30 to determine the update frequency level of the logical page in the refresh processing. Thus, even when the update frequency level of the logical page has changed from that at the time of new write, an appropriate update frequency level can be set to the logical page, and the logical page can be allocated to a block having an appropriate degradation rank.

The FMPK 30 can migrate valid data stored in a block where an error has occurred to a block having the same degradation rank.

The FMPK 30 can determine valid data stored in an uncompleted block where the uncompleted block time has elapsed from the write as data whose update frequency is relatively low, and migrate the data to a block having a degradation rank of Old as compressed data, thereby improving the performance and the life of the FMPK 30. The FMPK 30 can determine valid data stored in a completed block where the completed block time has elapsed from the write, as data whose update frequency is relatively low, and migrate the data to a block having a degradation rank of Old as compressed data, thereby improving the performance and the life of the FMPK 30.

This invention is not limited to the embodiment described above, and can be modified into other various forms without the range not departing from the gist of this invention.

REFERENCE SIGNS LIST

10 Host computer
20' Host apparatus
20 Storage controller
30 FMPK
31 NOR flash memory
32 Device controller
33 NAND flash memory
41 SAS controller
42 CPU
43 Bus switch
44 High-speed memory
45 Low-speed memory
46 Flash memory controller
47 DRAM controller
48 DPAC (compression and expansion circuit)
70 Management terminal
300 Storage apparatus

The invention claimed is:
1. A storage apparatus, comprising:
a non-volatile memory that includes a plurality of blocks, wherein each of the plurality of blocks includes a plurality of physical pages; and
a storage controller coupled to the non-volatile memory and to a host computer; and
a device controller coupled to the non-volatile memory and to the storage controller,
wherein the storage controller is configured to:
determine, based on management information for a specified logical address range, an update frequency level indicating a degree of update frequency of the specified logical address range, and
transmit the specified logical address range, the update frequency level of the specified logical address range, and specified data to the device controller,
wherein the device controller is configured to:
divide a logical address space to be provided to the storage controller into a plurality of logical pages,
select a specified logical page corresponding to the specified logical address range from among the plurality of logical pages,
set the update frequency level of the specified logical address range to the update frequency level of the specified logical page,
select a specified block from among the plurality of blocks based on the update frequency level of the specified logical page,
select a specified physical page in the specified block,
allocate the specified physical page to the specified logical page,
monitor a state of the non-volatile memory,
execute reclamation processing based on the state of the non-volatile memory, wherein the reclamation processing includes: determining whether to migrate data stored in the specified block according to the state of the non-volatile memory, and when a determination is made to migrate the data stored in the specified block, selecting a migration destination block from among the plurality of blocks according to the update frequency level of the specified logical page, migrating the specified data from the specified physical page to a migration destination physical page in the migration destination block, and allocating the migration destination physical page to the specified logical page,
obtain a reclamation count, which is the number of times by which the specified data has been migrated to the specified logical page by a plurality of reclamation processings without being updated,
determine an update frequency level of the specified logical page based on the reclamation count of the specified logical page,
determine whether to compress the specified data based on the update frequency level of the specified logical page,
determine whether to compress the specified data based on the update frequency level of the specified logical address range,
when a determination is made to compress the specified data, compress the specified data to generate compressed data, and write the compressed data into the migration destination physical, and
when a determination is made not to compress the specified data, write the specified data into the migration destination physical page.

2. The storage apparatus according to claim 1, wherein, when the device controller receives a write command to instruct updating of the specified data from the storage controller, the device controller is configured to reset the reclamation count of the specified logical page.

3. The storage apparatus according to claim 2, wherein the device controller is configured to determine whether the specified block includes a free physical page,
when a determination is made that the specified block includes a free physical page, the device controller is configured to determine whether an elapsed time from the start of write into the specified block is equal to or larger than a first time set in advance, and when a determination is made that the elapsed time from the start of the write into the specified block is equal to or larger than the first time, set an update frequency level of the specified logical page, select the migration destination block according to the update frequency level of the specified logical page, migrate the specified data from the specified physical page to the migration destination physical page, and allocate the migration destination physical page to the specified logical page, and
when a determination is made that the specified block does not include any free physical page, the device controller is configured to determine whether an elapsed time from the start of write into the specified block is equal to or larger than a second time set in advance, which is longer than the first time, and when a determination is made that the elapsed time from the start of write into the specified block is equal to or larger than the second time, set an update frequency level of the specified logical page, select the migration destination block according to the update frequency level of the specified logical page, migrate the specified data from the specified physical page to the migration destination physical page, and allocate the migration destination physical page to the specified logical page.

4. The storage apparatus according to claim 3, wherein, when an error has occurred in the specified block, the device controller is configured to select the migration destination block according to the update frequency level of the specified logical page, migrate the specified data from the specified physical page to the migration destination physical page, and allocate the migration destination physical page to the specified logical page.

5. The storage apparatus according to claim 2, wherein the update frequency level is any one of a plurality of levels including a first level and a second level indicating that the update frequency of the specified logical page is higher than the first level, and
the device controller is configured to determine to compress the specified data when the update frequency level of the specified logical page is the first level.

6. The storage apparatus according to claim 5, wherein the device controller is configured to measure a read frequency of a specified physical storage area including the specified physical page, and when the reclamation count of the specified logical page exceeds a reclamation count threshold and when the read frequency of the specified physical storage area satisfies a read frequency condition set in advance, set the first level to the update frequency level of the specified logical page.

7. The storage apparatus according to claim 5, wherein the device controller is configured to measure a degree of degradation for each of the plurality of blocks, and set, for each block, a degradation rank representing a degree of degradation of the block, a value of the degradation rank of the block is one of a plurality of ranks including a first rank and a second rank indicating that the degree of degradation of the block is lower than the first rank, and
when an update frequency level of the specified logical page is the first level, the device controller is configured to allocate a physical page in a block having a value of the first rank among the plurality of blocks to the specified logical page.

8. The storage apparatus according to claim 5, wherein, when the device controller receives any of a write command to instruct updating of the specified data and a read command to instruct reading of the specified data from the storage controller, the device controller is configured to set the update frequency level of the specified logical page to the second level.

9. The storage apparatus according to claim 2, wherein, in the reclamation processing, the device controller is configured to write the reclamation count of the specified logical page into the migration destination physical page.

10. The storage apparatus according to claim 9, wherein the device controller is configured to write the update frequency level of the specified logical page into the specified physical page.

11. A non-volatile memory device, comprising:
a non-volatile memory that includes a plurality of blocks, wherein each of the plurality of blocks includes a plurality of physical pages; and
a device controller coupled to the non-volatile memory and a host apparatus, wherein the device controller is configured to:
receive, from the host apparatus, a specified logical address range, an update frequency level representing a degree of update frequency of the specified logical address range, and specified data,
divide a logical address space to be provided to the host apparatus into a plurality of logical pages,
select a specified logical page corresponding to the specified logical address range from among the plurality of logical pages,
set the update frequency level of the specified logical address range to the update frequency level of the specified logical page,
select a specified block from among the plurality of blocks based on the update frequency level of the specified logical page,
select a specified physical page in the specified block,
allocate the specified physical page to the specified logical page,
monitor a state of the non-volatile memory,
execute reclamation processing based on the state of the non-volatile memory, wherein the reclamation processing includes: determining whether to migrate data stored in the specified block according to the state of the non-volatile memory, and when a determination is made to migrate the data stored in the specified block, selecting a migration destination block from among the plurality of blocks according to the update frequency level of the specified logical page, migrating the specified data from the specified physical page to a migration destination physical page in the migration destination block, and allocating the migration destination physical page to the specified logical page,
obtain a reclamation count, which is the number of times by which the specified data has been migrated to the specified logical page by a plurality of reclamation processings without being updated, determine an update frequency level of the specified logical page based on the reclamation count of the specified logical page, determine whether to compress the specified data based on the update frequency level of the specified logical page, determine whether to compress the specified data based on the update frequency level of the specified logical address range, when a determination is made to compress the specified data, compress the specified data to generate compressed data, and write the compressed data into the migration destination physical page, and when a determination is made not to compress the specified data, write the specified data into the migration destination physical page.

* * * * *